(12) United States Patent
Nishimori et al.

(10) Patent No.: US 9,276,072 B2
(45) Date of Patent: Mar. 1, 2016

(54) SEMICONDUCTOR DEVICE AND METHOD FOR MANUFACTURING SEMICONDUCTOR DEVICE

(71) Applicant: FUJITSU LIMITED, Kawasaki-shi, Kanagawa (JP)

(72) Inventors: Masato Nishimori, Atsugi (JP); Toshihide Kikkawa, Aizu-Wakamatsu (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/518,214

(22) Filed: Oct. 20, 2014

(65) Prior Publication Data
US 2015/0129888 A1 May 14, 2015

(30) Foreign Application Priority Data
Nov. 13, 2013 (JP) .................. 2013-235278

(51) Int. Cl.
| | |
|---|---|
| H01L 29/40 | (2006.01) |
| H01L 29/66 | (2006.01) |
| H01L 29/78 | (2006.01) |
| H01L 21/28 | (2006.01) |
| H01L 29/417 | (2006.01) |
| H01L 29/423 | (2006.01) |
| H01L 29/778 | (2006.01) |
| H01L 29/10 | (2006.01) |
| H01L 29/20 | (2006.01) |

(52) U.S. Cl.
CPC ........ H01L 29/402 (2013.01); H01L 21/28264 (2013.01); H01L 29/1029 (2013.01); H01L 29/41725 (2013.01); H01L 29/42316 (2013.01); H01L 29/66462 (2013.01); H01L 29/7787 (2013.01); *H01L 29/2003* (2013.01)

(58) Field of Classification Search
None
See application file for complete search history.

(56) References Cited

U.S. PATENT DOCUMENTS

| | | | |
|---|---|---|---|
| 6,555,883 B1 * | 4/2003 | Disney et al. | ................ 257/401 |
| 2007/0164326 A1 | 7/2007 | Okamoto | |
| 2010/0155720 A1 * | 6/2010 | Kaneko | ......................... 257/43 |

FOREIGN PATENT DOCUMENTS

| | | |
|---|---|---|
| JP | H8-64809 | 3/1996 |
| JP | H10-32349 | 2/1998 |
| JP | 2002-359256 A1 | 12/2002 |
| WO | WO 2005/081304 A1 | 9/2005 |

* cited by examiner

*Primary Examiner* — Stanetta Isaac
(74) *Attorney, Agent, or Firm* — Kratz, Quintos & Hanson, LLP

(57) ABSTRACT

A semiconductor device includes: a first nitride semiconductor layer formed over a substrate; a second nitride semiconductor layer formed over the first nitride semiconductor layer; element isolation regions formed in a part of the second nitride semiconductor layer and the first nitride semiconductor layer; a gate electrode, source electrodes, and a drain electrode formed over the second semiconductor layer and the element isolation regions; and a drain field plate formed in such a manner as to project from upper portions of side surfaces of the drain electrode.

14 Claims, 31 Drawing Sheets

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority of the prior Japanese Patent Application No. 2013-235278, filed on Nov. 13, 2013, the entire contents of which are incorporated herein by reference.

FIELD

The embodiments discussed herein are related to a semiconductor device and a method for manufacturing a semiconductor device.

BACKGROUND

GaN, AlN, and InN which are nitride semiconductors or materials containing a mixed crystal thereof have a wide band gap and have been used for high-power electron devices, short wavelength light emitting devices, or the like. Among the above, as the high-power electron devices, a technique relating to a field effect transistor (FET), particularly, a high electron mobility transistor (HEMT) has been developed. The HEMT employing such nitride semiconductors may realize large current, high voltage, and low on-state resistance operation, and therefore has been used for high-power and high-efficiency amplifiers, high-power switching devices, and the like.

For example, GaN which is a nitride semiconductor has a band gap of 3.4 eV which is larger than the band gap (1.1 eV) of Si and the band gap (1.4 eV) of GaAs and has high breakdown electric field strength. Therefore, GaN is very promising as a material of a semiconductor device for power source with which high-voltage operation and high power are obtained.

Examples of the HEMT described above include a HEMT employing GaN as an electron transit layer and AlGaN as an electron supply layer. In the HEMT employing GaN as an electron transit layer and AlGaN as an electron supply layer, distortion resulting from difference between the grating constant of GaN and the grating constant of AlGaN generates in AlGaN. Due to difference between the piezoelectric polarization and the spontaneous polarization of AlGaN thus generated, a high-concentration two dimensional electron gas (2DEG) is generated in the electron transit layer. Therefore, the HEMT has been expected as a high-efficiency switch element and a high withstand voltage power device for electric vehicles and the like. In recent years, in order to reduce the substrate cost, a technique of growing a HEMT formed of a nitride semiconductor on a low-cost Si substrate has been researched.

However, in the case where the HEMT is formed by growing an electron transit layer and an electron supply layer with nitride semiconductors on a substrate, such as a Si substrate, when the substrate has conductivity, a strong electric field is applied to the nitride semiconductor layers. In this case, the strongest electric field is applied particularly to end portions of a drain electrode due to large potential displacement, and thus breakdown or the like is likely to occur at the drain electrode ends, which results in reduction in reliability.

Therefore, in the semiconductor device including nitride semiconductors formed on a substrate such as a Si substrate, a highly-reliable semiconductor device in which breakdown or the like does not occur at the drain electrode ends has been desired.

The followings are reference documents.
[Document 1] Japanese Laid-open Patent Publication No. 2002-359256 and
[Document 2] Japanese Laid-open Patent Publication No. 10-32349.

SUMMARY

According to an aspect of the invention, a semiconductor device includes: a first nitride semiconductor layer formed over a substrate; a second nitride semiconductor layer formed over the first nitride semiconductor layer; element isolation regions formed in a part of the second nitride semiconductor layer and the first nitride semiconductor layer; a gate electrode, source electrodes, and a drain electrode formed over the second semiconductor layer and the element isolation regions; and a drain field plate formed in such a manner as to project from upper portions of side surfaces of the drain electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
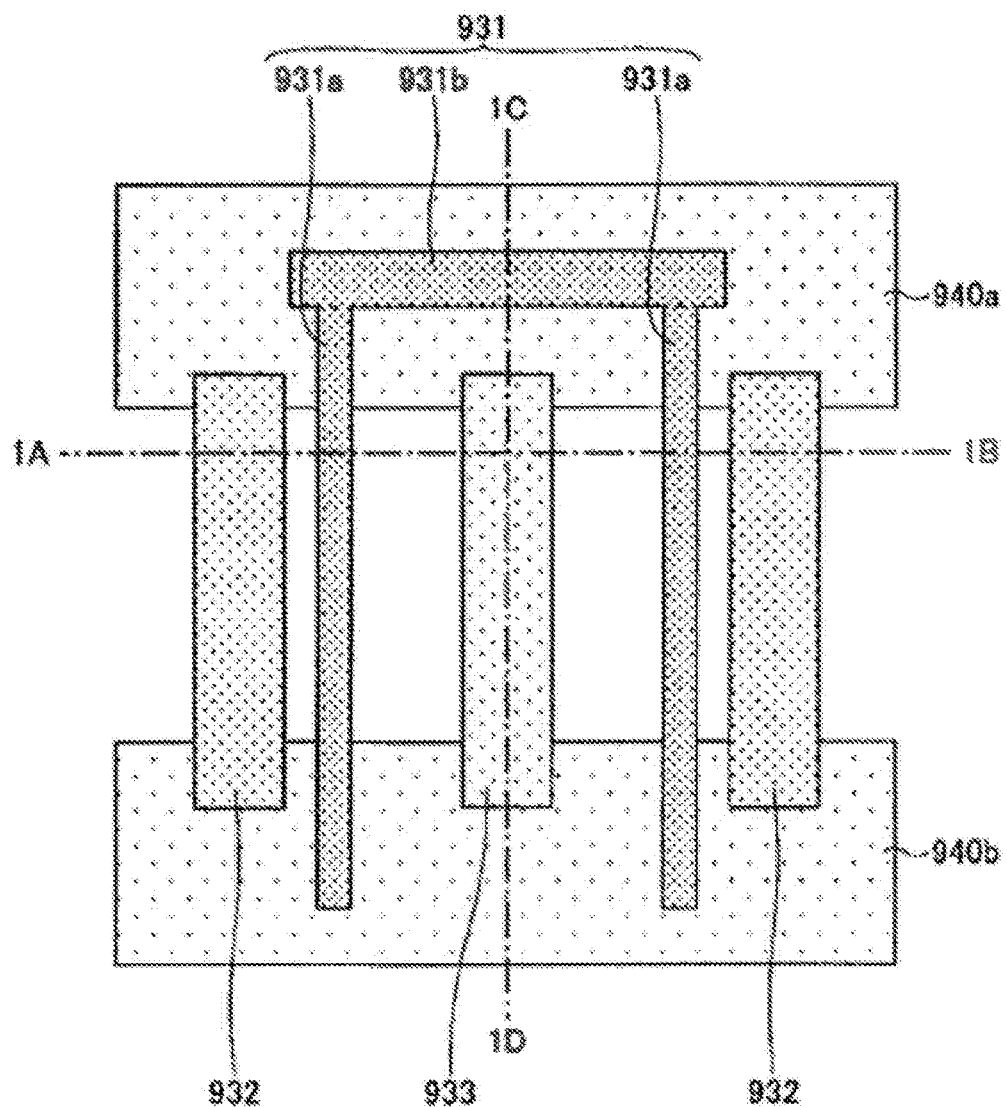
FIG. 1 is a top view of a semiconductor device.

The embodiments are described below. The same members and the like are designated by the same reference numerals and the description thereof is omitted.

Figure 2A:
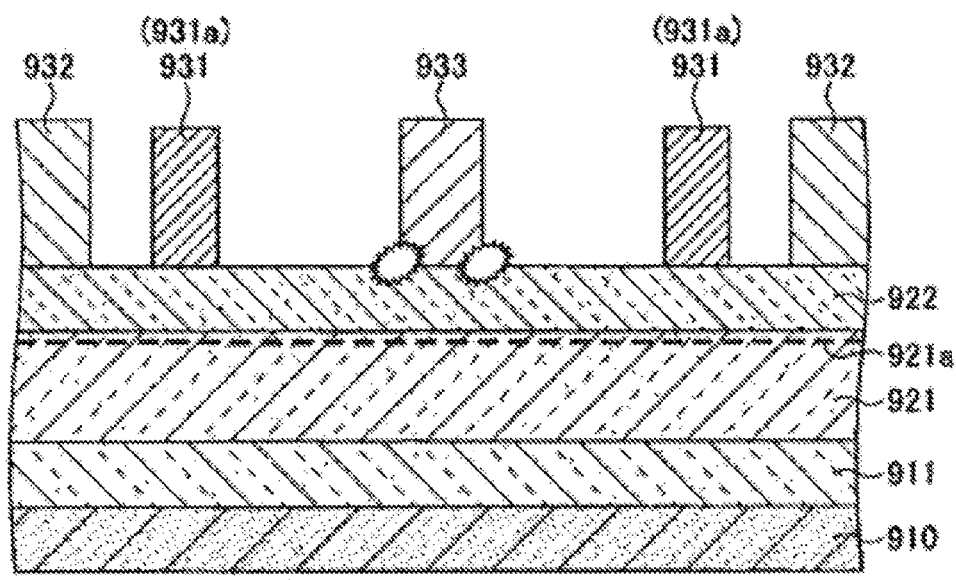
FIGS. 2A and 2B are cross sectional views of a semiconductor device.
Figure 2B:
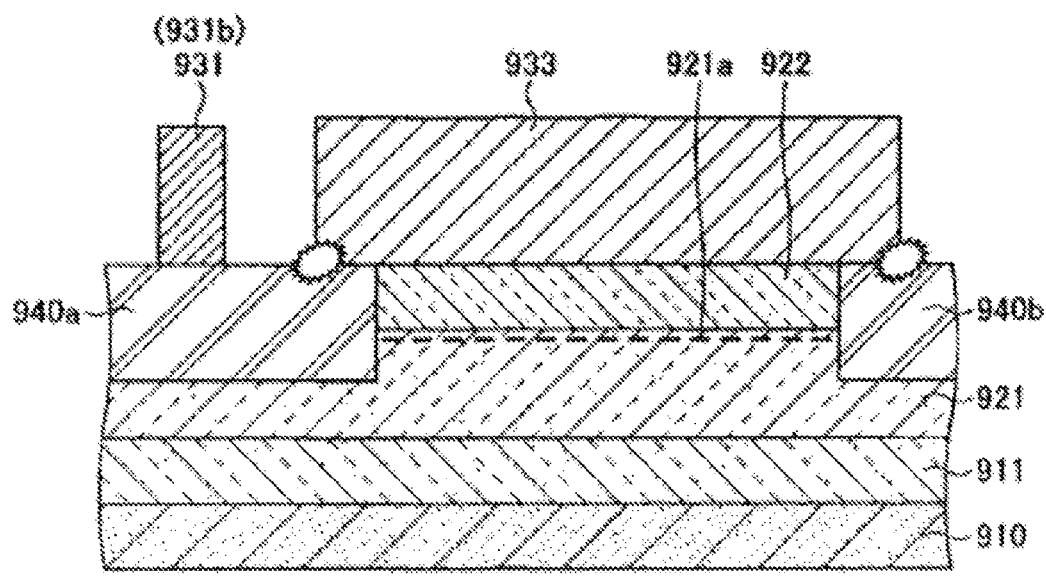

First, in a HEMT which is a semiconductor device, breakdown that occurs at end portions of a drain electrode is described with reference to FIG. 1 and FIGS. 2A and 2B. The HEMT having the structure shown in FIG. 1 and FIGS. 2A and 2B is formed by crystal growth of a nitride semiconductor on a Si substrate. FIG. 2A is a cross sectional view taken along the alternate long and short dash lines IIA-IIA in FIG. 1. FIG. 2B is a cross sectional view taken along the alternate long and short dash lines IIB-IIB in FIG. 1.

In the HEMT having the structure illustrated in FIG. 1 and FIGS. 2A and 2B, a buffer layer 911 is formed on a Si substrate 910 or the like and, on the buffer layer 911, an electron transit layer 921 and an electron supply layer 922 are stacked. The buffer layer 911 is formed of AlN, AlGaN, or the like. The electron transit layer 921 is formed of i-GaN or the like. The electron supply layer 922 is formed of i-AlGaN or the like. Thus, a 2DEG 921a is generated in the electron transit layer 921 near the interface between the electron transit layer 921 and the electron supply layer 922.

By performing ion implantation of Ar or the like, element isolation regions 940a and 940b are formed in a part of the electron supply layer 922 and the electron transit layer 921, and element isolation is achieved by the element isolation regions 940a and 940b thus formed.

On the electron supply layer 922, a gate electrode 931, source electrodes 932, and a drain electrode 933 are formed. Specifically, the drain electrode 933 is formed in the central portion and the source electrode 932 is formed at each of both sides of the drain electrode 933. More specifically, the drain electrode 933 is formed between the two source electrodes 932. The gate fingers 931a which form a part of the gate electrode 931 are each formed between the drain electrode 933 and the source electrodes 932. The gate electrode 931 has the two gate fingers 931a thus formed and a gate finger connection portion 931b for connecting the two gate fingers 931a. The source electrodes 932 and the drain electrode 933 are formed in a thin and long rectangular shape and are formed in such a manner that the longitudinal directions are almost the same direction.

The gate fingers 931a of the gate electrode 931, the source electrodes 932, and the drain electrode 933 formed on the electron supply layer 922 are formed in such a manner as to extend from above one element isolation region 940a to above the other element isolation region 940b. The gate finger connection portion 931b of the gate electrode 931 is formed on one element isolation region 940a.

In the semiconductor device of such a structure, the Si substrate 910 or the like doped with impurity elements, such as boron (B), to be a p-type substrate with low resistance is used in some cases. In heating and thermal treatment when forming a film, Ga contained in the electron transit layer 921 diffuses into the substrate 910, and the diffused Ga serves as an impurity element in the Si substrate 910 or the like, and therefore the resistance of the substrate 910 becomes low in some cases. Thus, when the resistance in the substrate 910 is low, electric field concentration occurs at an end portion of the drain electrode 933. Thus, when a high voltage is applied to the drain electrode 933, breakdown occurs near an end portion of the drain electrode 933. In particular, in nitride semiconductors containing GaN, AlGaN, or the like, a relatively high voltage is applied in some cases. When a relatively high voltage is applied, breakdown occurs also at an end portion of the drain electrode 933 formed on the element isolation region 940a. FIG. 1 is a view illustrating a part of the structure of the HEMT, and one having such a structure may be repeatedly formed.

First Embodiment

Semiconductor Device

Figure 3:
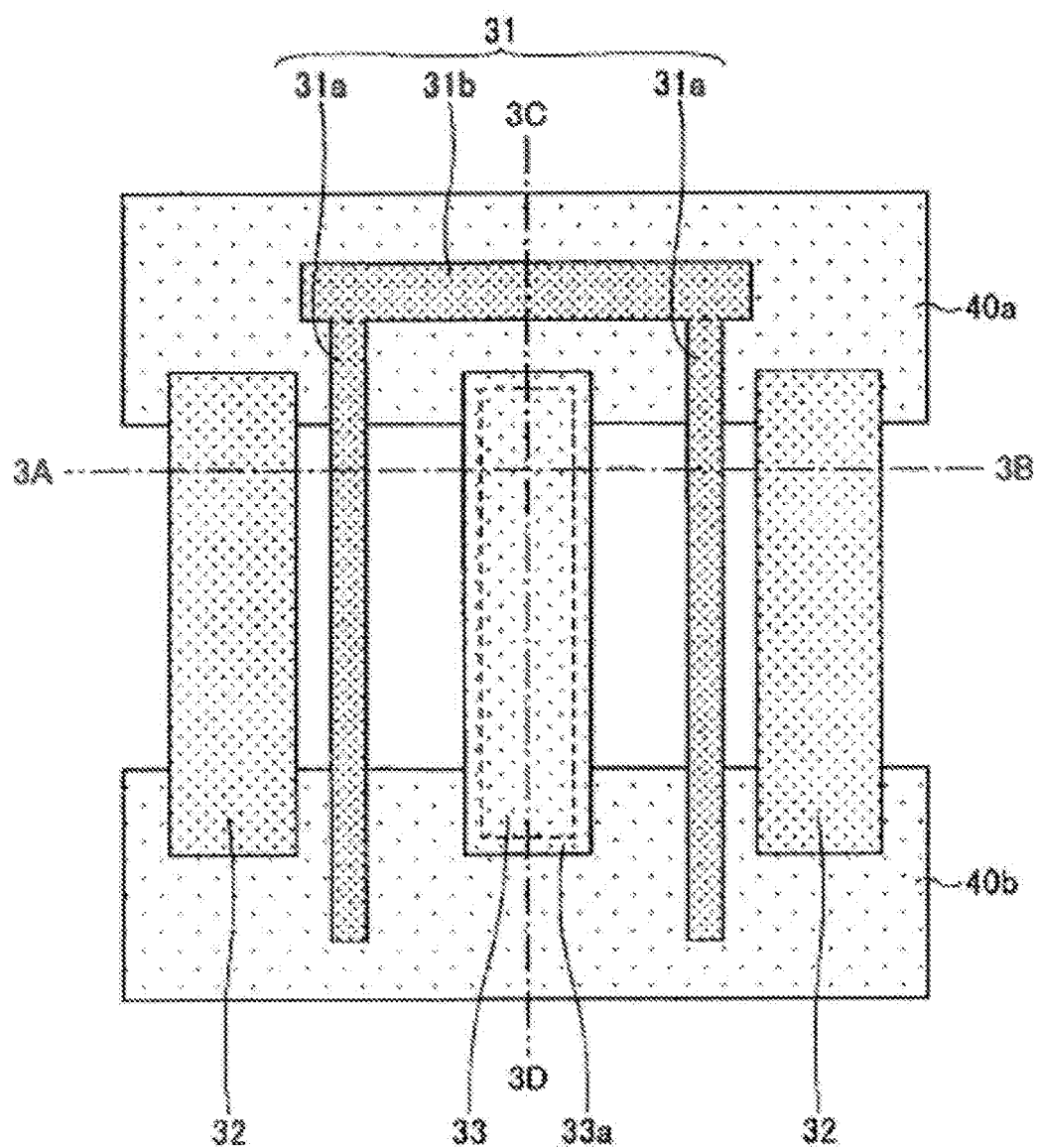
FIG. 3 is a top view of a semiconductor device in a first embodiment.
Figure 4A:
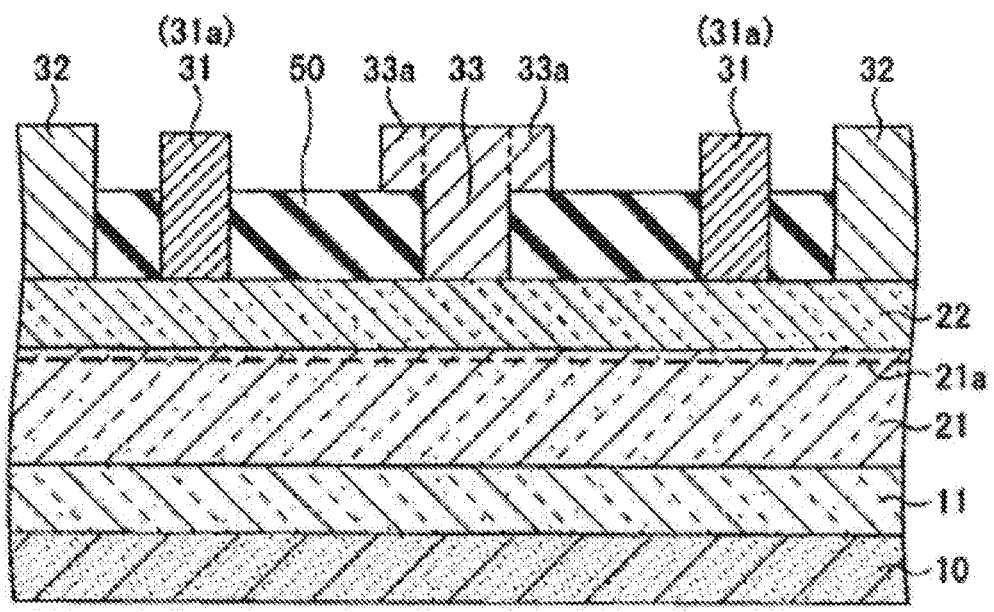
FIGS. 4A and 4B are cross sectional views of the semiconductor device in the first embodiment.
Figure 4B:
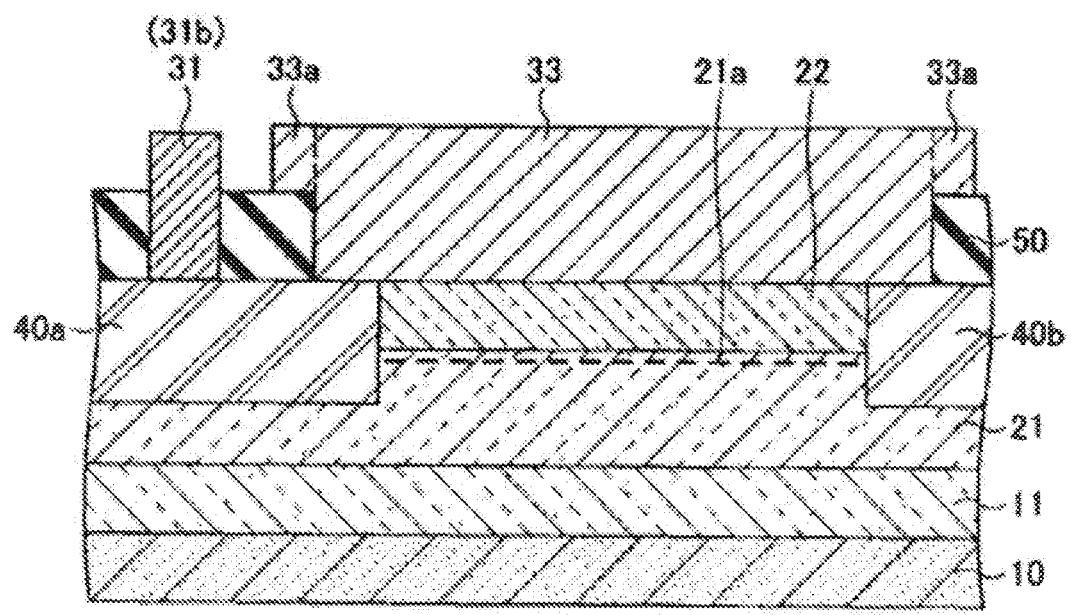

Next, a semiconductor device in this embodiment is described with reference to FIG. 3 and FIGS. 4A and 4B. FIG. 4A is a cross sectional view taken along the alternate long and short dash lines IVA-IVA in FIG. 3. FIG. 4B is a cross sectional view taken along the alternate long and short dash lines IVB-IVB in FIG. 3.

In a HEMT which is a semiconductor device in this embodiment, a buffer layer 11 is formed on a Si substrate 10 or the like and, on the buffer layer 11, an electron transit layer 21 which is a first semiconductor layer and an electron supply layer 22 which is a second semiconductor layer are stacked. The buffer layer 11 is formed of AlN, AlGaN, or the like. The electron transit layer 21 is formed of i-GaN or the like. The electron supply layer 22 is formed of i-AlGaN or the like. Thus, a 2DEG 21a is generated in the electron transit layer 21 near the interface between the electron transit layer 21 and the electron supply layer 22. The use of the Si substrate for the substrate 10 is preferable from the viewpoint of cost reduction.

By performing ion implantation of Ar or the like, element isolation regions 40a and 40b are formed in a part of the electron supply layer 22 and the electron transit layer 21, and element isolation is achieved by the element isolation regions 40a and 40b thus formed.

On the electron supply layer 22, a gate electrode 31, source electrodes 32, and a drain electrode 33 are formed. Specifically, the drain electrode 33 is formed in the central portion and the source electrode 32 is formed at each of both sides of the drain electrode 33. More specifically, the drain electrode 33 is formed between the two source electrodes 32. The gate fingers 31a which form a part of the gate electrode 31 are each formed between the drain electrode 33 and the source electrodes 32. The gate electrode 31 has the two gate fingers 31a thus formed and a gate finger connection portion 31b for connecting the two gate fingers 31a. The source electrodes 32 and the drain electrode 33 are formed in a thin and long rectangular shape and are formed in such a manner that the longitudinal directions are almost the same direction.

In this embodiment, the drain electrode 33 has a drain field plate 33a whose upper portion projects in all directions around at end portions of the drain electrode 33. More specifically, in this embodiment, the drain field plate 33a is provided also at the end portions of the drain electrode 33 on the element isolation region 40a. In FIG. 3 and FIGS. 4A and 4B, the drain field plate 33a has a structure in which the drain field plate 33a is formed on an insulating layer 50 formed on the electron supply layer 22 or the like around the drain electrode 33 but a structure in which the insulating layer 50 is not formed may be acceptable. More specifically, FIG. 3 and FIGS. 4A and 4B illustrate a structure in which the insulating layer 50 is provided around the drain electrode 33 on the element isolation region 40a, the electron supply layer 22, and the like, and the drain field plate 33a is provided on the insulating layer 50. However, in this embodiment, the drain field plate 33a may be formed in such a manner that a region where the insulating layer 50 is formed has space. In other words, the drain field plate 33a may be formed above the element isolation region 40a, the electron supply layer 22, and the like with the space therebetween.

The gate fingers 31a of the gate electrode 31, the source electrodes 32, and the drain electrode 33 formed on the electron supply layer 22 are formed in such a manner as to extend from above one element isolation region 40a to above the other element isolation region 40b. The gate finger connection portion 31b of the gate electrode 31 is formed on one element isolation region 40a.

In the semiconductor device in this embodiment, by providing the drain field plate 33a described above, breakdown that occurs at the end portions of the drain electrode 33 may be suppressed also in the case where a high voltage is applied to the drain electrode 33. In particular, breakdown at the end portions of the drain electrode 33 formed on the element isolation region 40a can be suppressed. FIG. 3 illustrates a part of the structure of the HEMT, and one having such a structure may be repeatedly formed.

The case where the drain electrode 33 is formed on the element isolation regions 40a and 40b is described as a preferable embodiment. However, one having a structure in which the drain electrode 33 is formed on the electron supply layer 22 and the drain field plate 33a is formed in such a manner as to project in all directions on the insulating layer 50 around the drain electrode 33 may be acceptable.

Method for Manufacturing Semiconductor Device

Next, a method for manufacturing the semiconductor device in this embodiment is described with reference to FIGS. 5 to 9.

Figure 5A:
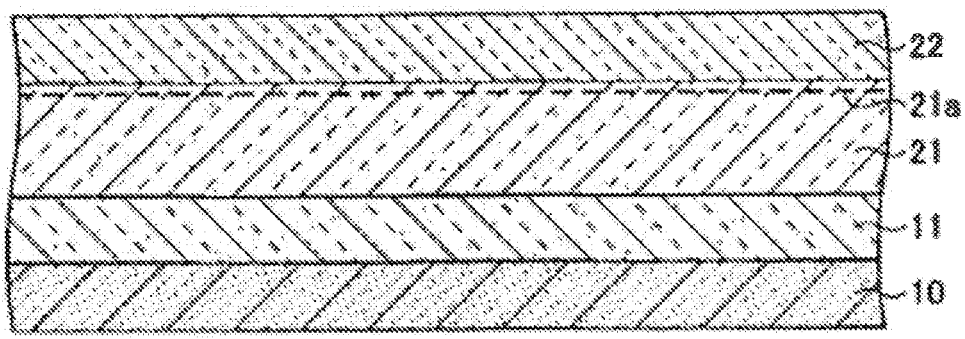
FIGS. 5A and 5B are drawings (1) of processes of a method for manufacturing the semiconductor device in the first embodiment.
Figure 5B:
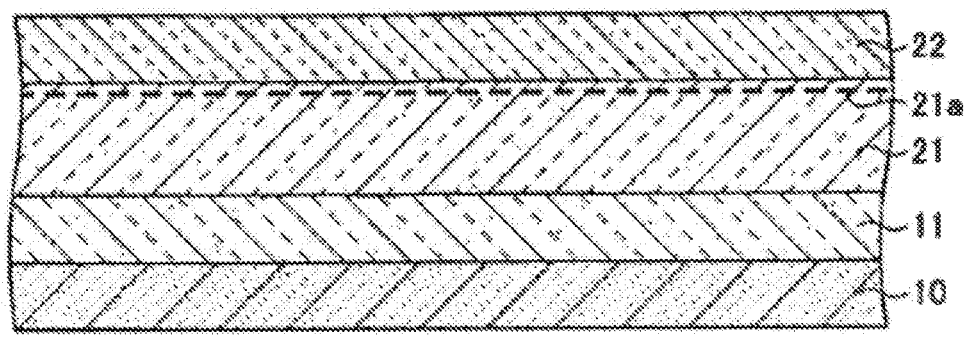

First, as illustrated in FIGS. 5A and 5B, the buffer layer 11, the electron transit layer 21, and the electron supply layer 22 are formed of a nitride semiconductor by epitaxial growth on the substrate 10 formed of Si or the like. FIG. 5A is a drawing corresponding to the cross section taken along the alternate long and short dash lines VA-VA in FIG. 3. FIG. 5B is a drawing corresponding to the cross section taken along the alternate long and short dash lines VB-VB in FIG. 3.

The substrate 10 may be one formed of SiC, sapphire, GaN, or the like other than Si. The buffer layer 11, the electron transit layer 21, and the electron supply layer 22 are formed by epitaxial growth. For example, the buffer layer 11, the electron transit layer 21, and the electron supply layer 22 may be formed by metal organic chemical vapor deposition (MOCVD) or molecular beam epitaxy (MBE). In this embodiment, the case of MOCVD is described.

The buffer layer 11 is formed of AlN, AlGaN, or the like. As a source gas when forming the buffer layer 11, trimethyl aluminum (TMA), trimethyl gallium (TMG), and ammonia ($NH_3$) are used. The buffer layer 11 is formed by supplying a predetermined amount of the source gases into a MOCVD chamber, and then epitaxially growing the same.

The electron transit layer 21 is formed of GaN having a film thickness of about 1 μm. As a source gas when forming the electron transit layer 21, TMG and ammonia are used and the electron transit layer 21 is formed by supplying a predetermined amount of the source gases into a MOCVD chamber, and then epitaxially growing the same.

The electron supply layer 22 is formed of $Al_{0.2}Ga_{0.8}N$ having a film thickness of about 20 nm. As a source gas when forming the electron supply layer 22, TMA, TMG, and ammonia are used and the electron supply layer 22 is formed by supplying a predetermined amount of the source gases into a MOCVD chamber, and then epitaxially growing the same. Thus, a 2DEG 21a is generated in the electron transit layer 21 near the interface between the electron transit layer 21 and the electron supply layer 22.

Figure 6A:
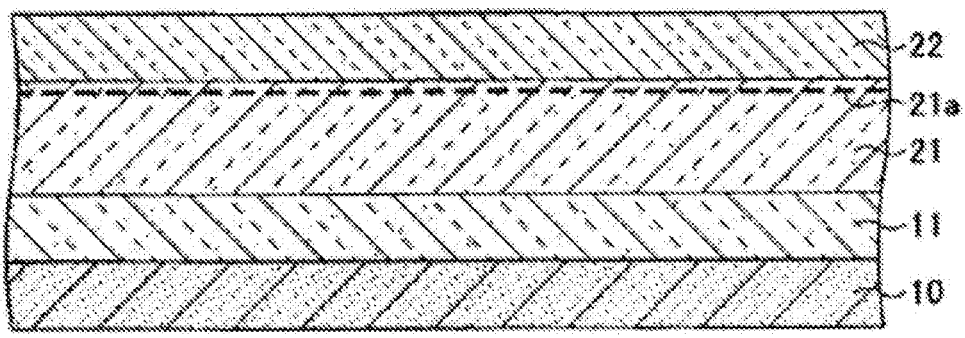
FIGS. 6A and 6B are drawings (2) of processes of the method for manufacturing the semiconductor device in the first embodiment.
Figure 6B:
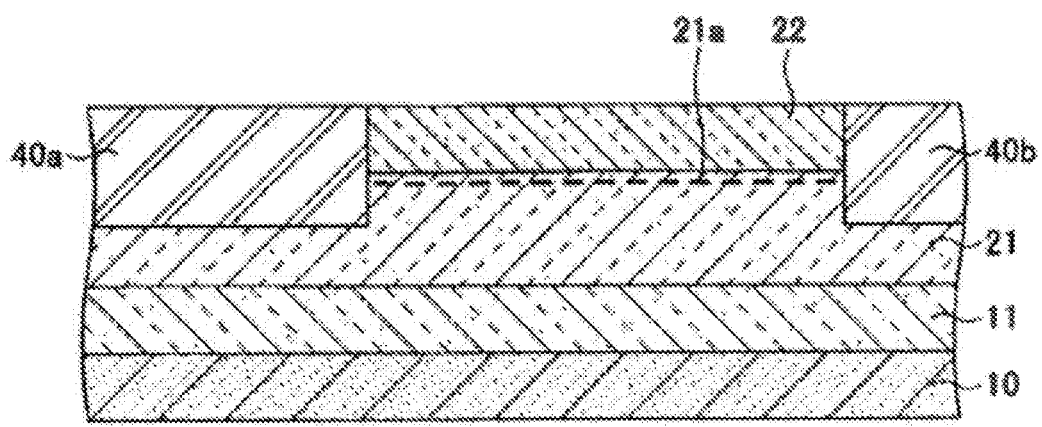

Next, as illustrated in FIGS. 6A and 6B, the element isolation regions 40a and 40b are formed in a part of the electron supply layer 22 and the electron transit layer 21. FIG. 6A is a drawing corresponding to the cross section taken along the alternate long and short dash lines VIA-VIA in FIG. 3. FIG. 6B is a drawing corresponding to the cross section taken along the alternate long and short dash lines VIB-VIB in FIG. 3.

Specifically, a resist pattern (not illustrated) having opening portions in regions where the element isolation regions 40a and 40b are to be formed is formed on the electron supply layer 22 by applying a photoresist, and then performing exposure by an exposure device and development. Thereafter, an inactive region is formed by performing ion implantation of ions, such as argon (Ar), into a part of the electron supply layer 22 and the electron transit layer 21 in the opening portions in a region where the resist pattern is not formed, to be semi-insulated. By the inactive region thus formed, the element isolation regions 40a and 40b are formed. Thereafter, the resist pattern (not illustrated) is removed with an organic solvent or the like. Examples of elements capable of forming the inactive region by ion implantation include, in addition to Ar, hydrogen (H), helium (He), nitrogen (N), fluorine (F), magnesium (Mg), zinc (Zn), oxygen (O), and the like.

Figure 7A:
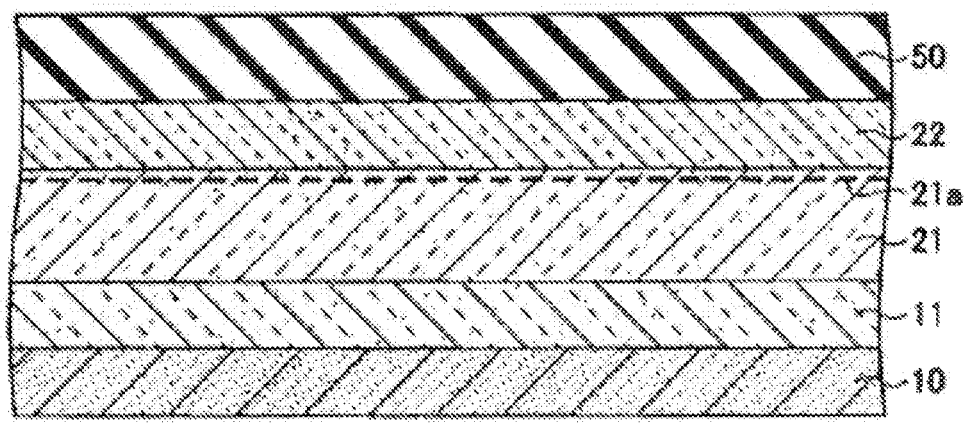
FIGS. 7A and 7B are drawings (3) of processes of the method for manufacturing the semiconductor device in the first embodiment.
Figure 7B:
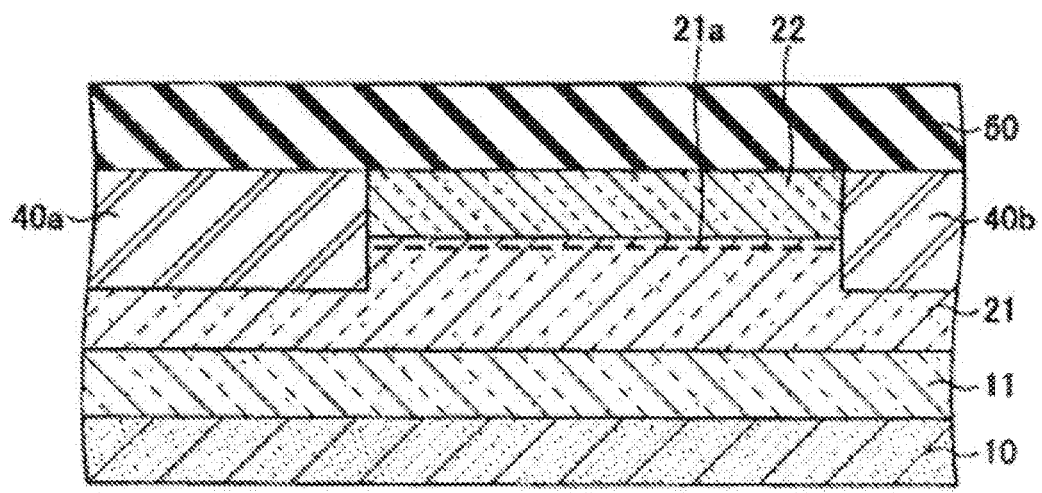

Next, as illustrated in FIGS. 7A and 7B, the insulating layer 50 is formed on the electron supply layer 22. Specifically, the insulating layer 50 is formed on the electron supply layer 22 by forming SiN (silicon nitride) into a film having a thickness of about 100 nm by chemical vapor deposition (CVD). As the insulating layer 50, $SiO_2$ (silicon oxide) may be used other than SiN. FIG. 7A is a drawing corresponding to the cross section taken along the alternate long and short dash lines VITA-VITA in FIG. 3. FIG. 7B is a drawing corresponding to the cross section taken along the alternate long and short dash lines VIIB-VIIB in FIG. 3.

Figure 8A:
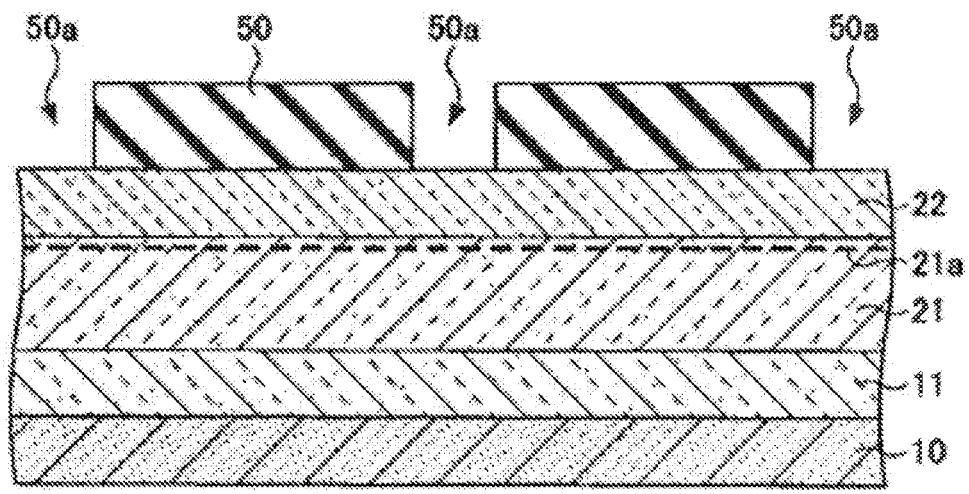
FIGS. 8A and 8B are drawings (4) of processes of the method for manufacturing the semiconductor device in the first embodiment.
Figure 8B:
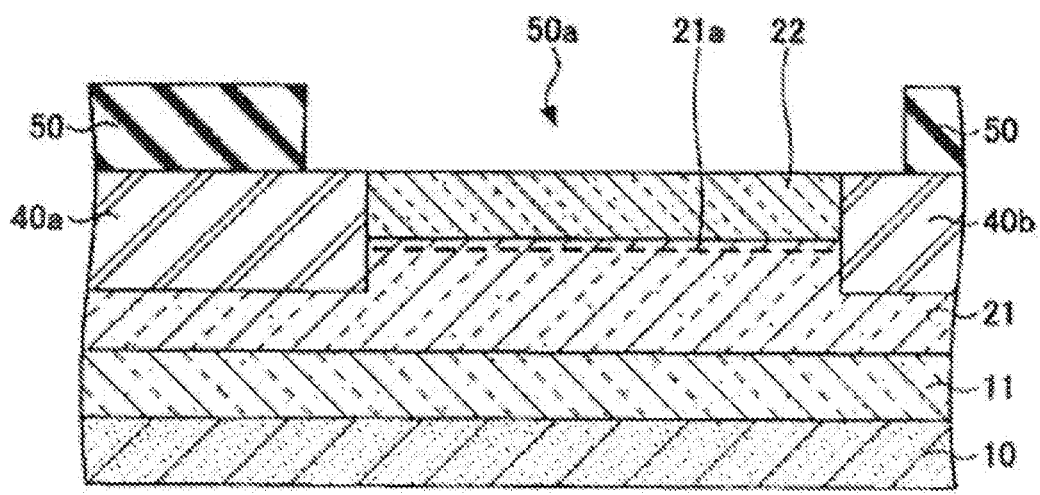

Next, as illustrated in FIGS. 8A and 8B, opening portions 50a are formed in regions where the source electrodes 32 and the drain electrode 33 are to be formed in the insulating layer 50. FIG. 8A is a drawing corresponding to the cross section taken along the alternate long and short dash lines VIIIA-VIIIA in FIG. 3. FIG. 8B is a drawing corresponding to the cross section taken along the alternate long and short dash lines VIIIB-VIIIB in FIG. 3.

Specifically, a resist pattern (not illustrated) having opening portions in regions where the source electrodes 32 and the drain electrode 33 are to be formed is formed on the insulating layer 50 by applying a photoresist, and then performing exposure by an exposure device and development. Thereafter, the insulating layer 50 in a region where the resist pattern is not formed is removed by dry etching, such as reactive ion etching (RIE), until the surface of the electron supply layer 22 is exposed. Thus, the opening portions 50a are formed in the insulating layer 50 in the regions where the source electrodes 32 and the drain electrode 33 are to be formed. Thereafter, the resist pattern (not illustrated) is removed with an organic solvent or the like.

Figure 9A:
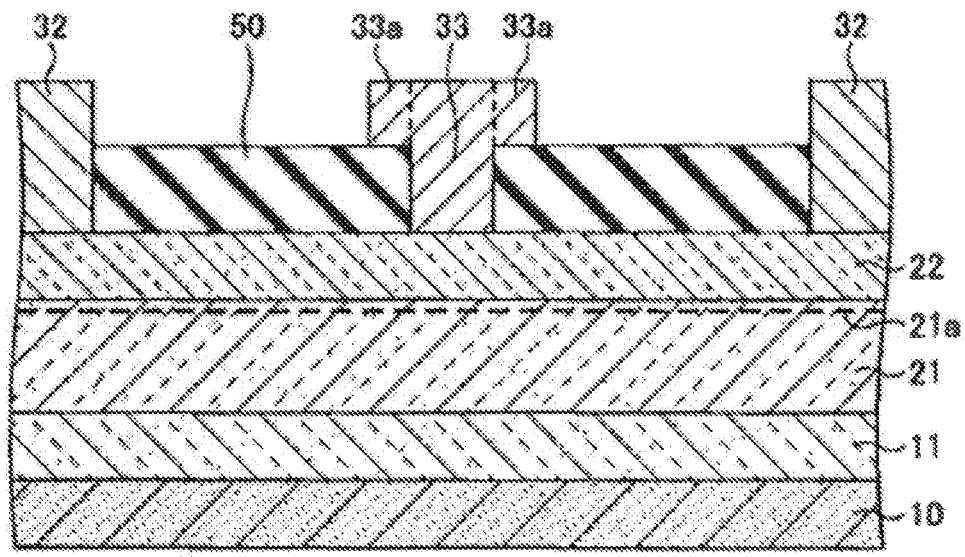
FIGS. 9A and 9B are drawings (5) of processes of the method for manufacturing the semiconductor device in the first embodiment.
Figure 9B:
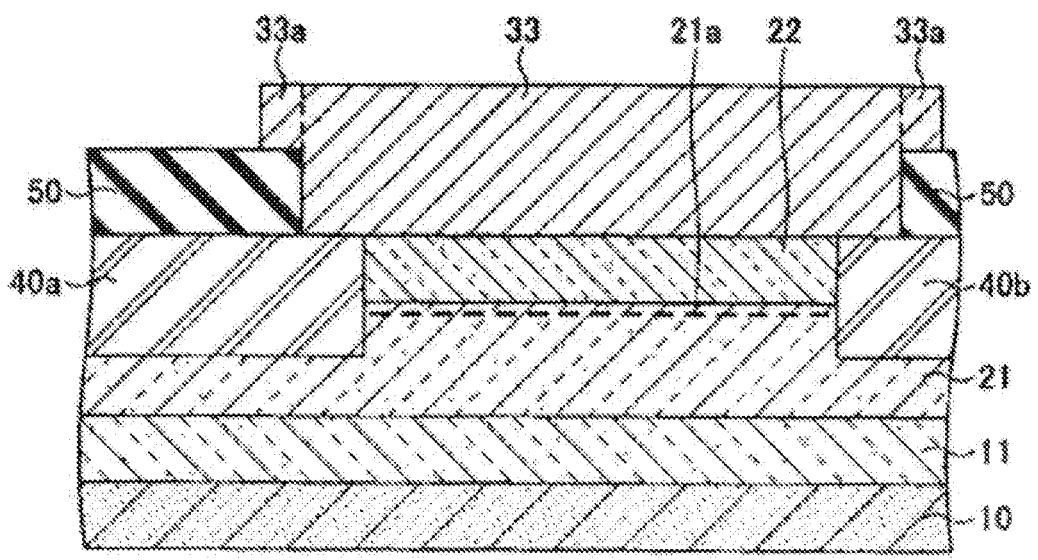

Next, as illustrated in FIGS. 9A and 9B, the source electrodes 32 and the drain electrode 33 are formed in the opening portions 50a in the insulating layer 50. FIG. 9A is a drawing corresponding to the cross section taken along the alternate long and short dash lines IXA-IXA in FIG. 3. FIG. 9B is a drawing corresponding to the cross section taken along the alternate long and short dash lines IXB-IXB in FIG. 3.

Specifically, a resist pattern (not illustrated) is formed by applying a photoresist to the surface of the insulating layer 50 and the electron supply layer 22, and then performing exposure by an exposure device and development again. The resist pattern formed here has opening portions in regions where the source electrodes 32, the drain electrode 33, and the drain field plate 33a are to be formed. Specifically, a resist pattern (not illustrated) having an opening portion larger than the opening portion 50a formed in the insulating layer 50 in order to form the drain electrode 33 is formed in a region where the drain electrode 33 is to be formed. Thereafter, a metal laminated film containing Ti/Al is formed into a film by vacuum deposition, and then the film is immersed in an organic solvent or the like, whereby the metal laminated film formed on the resist pattern is removed by liftoff together with the resist pattern. Thus, the source electrodes 32 and the drain electrode 33 are formed with the remaining metal laminated film. The metal laminated film containing Ti/Al here is formed by stacking a Ti film of about 100 nm and an Al film of about 300 nm. Thereafter, by performing Rapid Thermal Anneal (RTA) at a temperature of about 600° C., the source electrodes 32 and the drain electrode 33 are brought into ohmic contact with each other.

Around the drain electrode 33 thus formed, the drain field plate 33a is formed on the insulating layer 50. More specifically, in the drain electrode 33, an upper portion is formed to be wider than a lower portion contacting the electron supply layer 22 and a portion which is an upper portion of the drain electrode 33 and is formed on the insulating layer 50 becomes the drain field plate 33a. Thus, in the semiconductor device in this embodiment, the drain field plate 33a projecting at the upper portion is formed around the drain electrode 33.

Figure 10A:
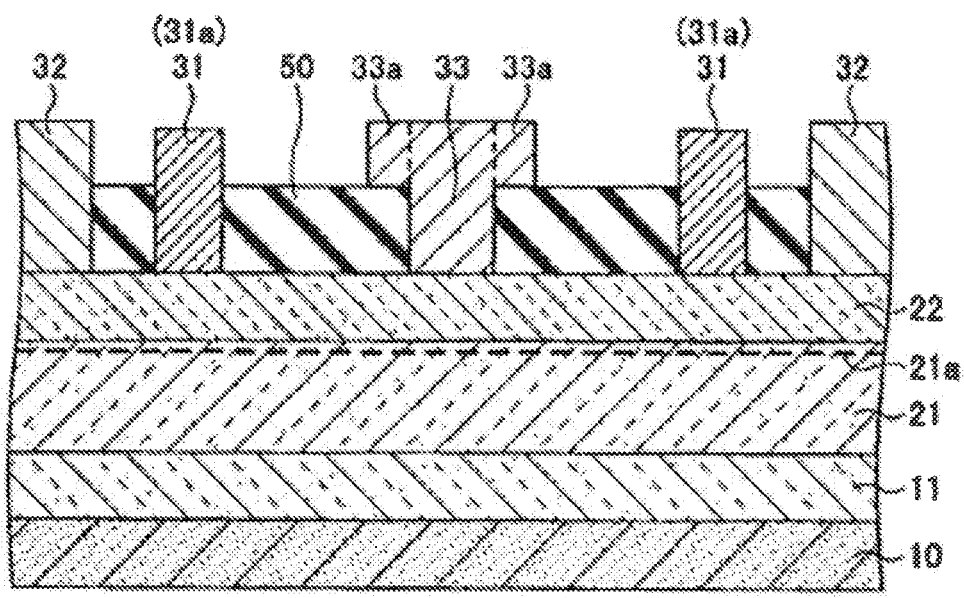
FIGS. 10A and 10B are drawings (6) of processes of the method for manufacturing the semiconductor device in the first embodiment.
Figure 10B:
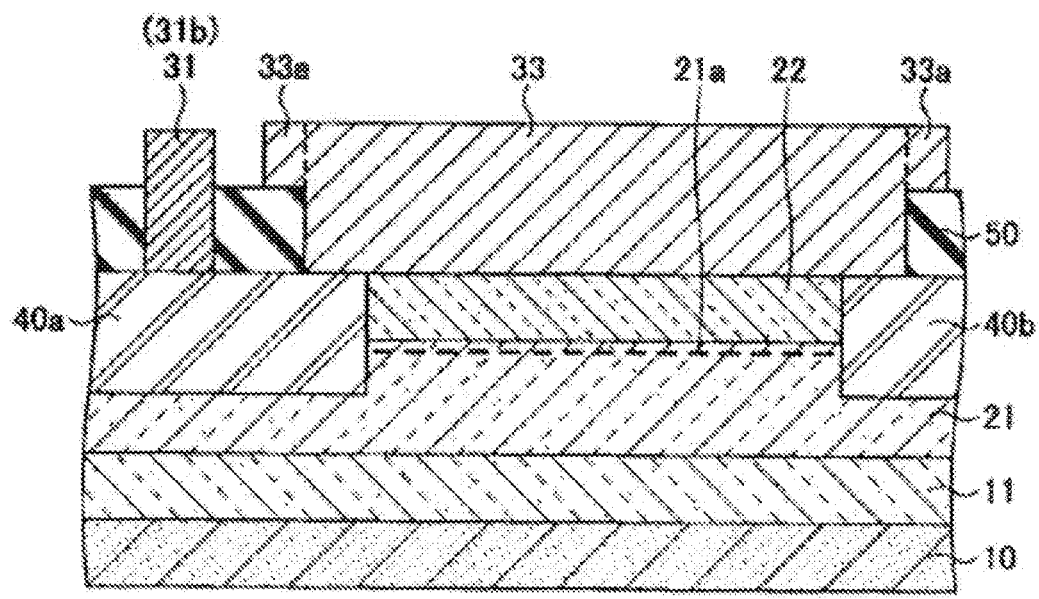

Next, as illustrated in FIGS. 10A and 10B, in the insulating layer 50, an opening portion is formed in a region where the gate electrode 31 is to be formed, and then the gate electrode 31 is formed in the formed opening portion. FIG. 10A is a drawing corresponding to the cross section taken along the alternate long and short dash lines XA-XA in FIG. 3. FIG. 10B is a drawing corresponding to the cross section taken along the alternate long and short dash lines XB-XB in FIG. 3.

Specifically, a resist pattern (not illustrated) having an opening portion in a region where the gate electrode 31 is to be formed is formed on the insulating layer 50 by applying a photoresist, and then performing exposure by an exposure device and development. Thereafter, the insulating layer 50 in a region where the resist pattern is not formed is removed by dry etching, such as RIE, until the surface of the electron supply layer 22 is exposed. Here, a gate recess may be formed by partially removing the electron supply layer 22. Thereafter, a metal laminated film containing Ni/Au is formed by vacuum deposition, and then the film is immersed in an organic solvent or the like, whereby the metal laminated film formed on the resist pattern is removed by liftoff together with the resist pattern. Thus, the gate electrode 31 is formed with the remaining metal laminated film. The gate electrode 31 thus formed has the gate fingers 31a formed between the source electrodes 32 and the drain electrode 33 and the gate finger connection portion 31b connecting the gate fingers 31a. The metal laminated film containing Ni/Au here is formed by stacking a Ni film of about 50 nm and an Au film of about 300 nm.

The semiconductor device in this embodiment may be manufactured by the above-described processes.

Figure 11:
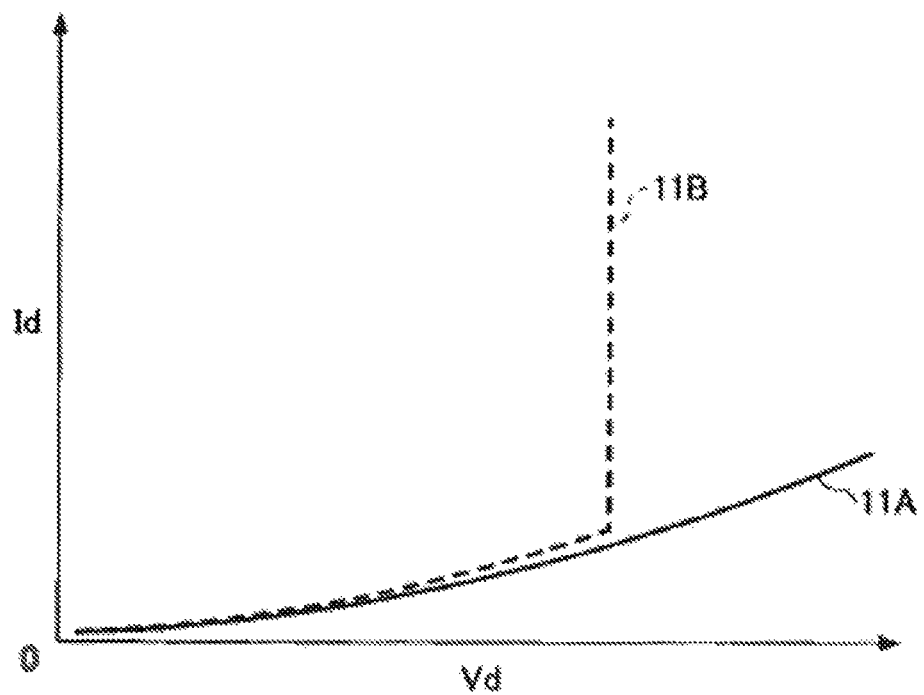
FIG. 11 is a characteristic diagram of drain voltage Vd-drain current Id in a semiconductor device.

Next, FIG. 11 illustrates the relationship between a drain voltage Vd and a drain current Id in the semiconductor device in this embodiment and the semiconductor device having the structure illustrated in FIG. 1 and FIGS. 2A and 2B. In FIG. 11, the curve 11A represents the characteristics of the semiconductor device in this embodiment and the curve 11B represents the characteristics of the semiconductor device having the structure illustrated in FIG. 1 and FIGS. 2A and 2B. As illustrated in FIG. 11, the semiconductor device in this embodiment is able to raise a voltage at which breakdown occurs, that is, to increase withstand voltage, rather than the semiconductor device having the structure illustrated in FIG. 1 and FIGS. 2A and 2B.

Second Embodiment

Next, a second embodiment is described. This embodiment describes a structure in which element isolation regions are formed by etching.

Semiconductor Device

Figure 12:
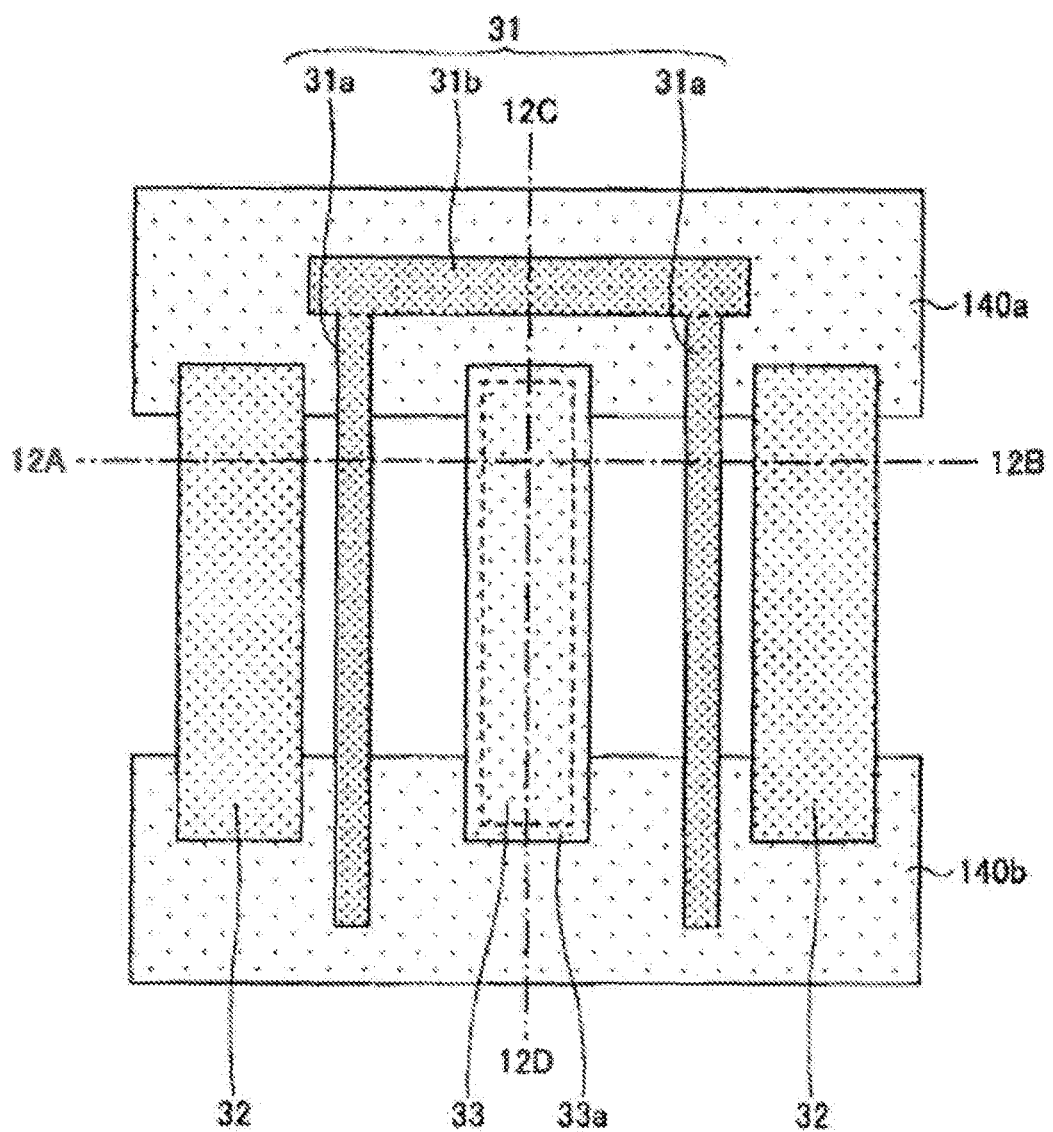
FIG. 12 is a top view of a semiconductor device in a second embodiment.
Figure 13A:
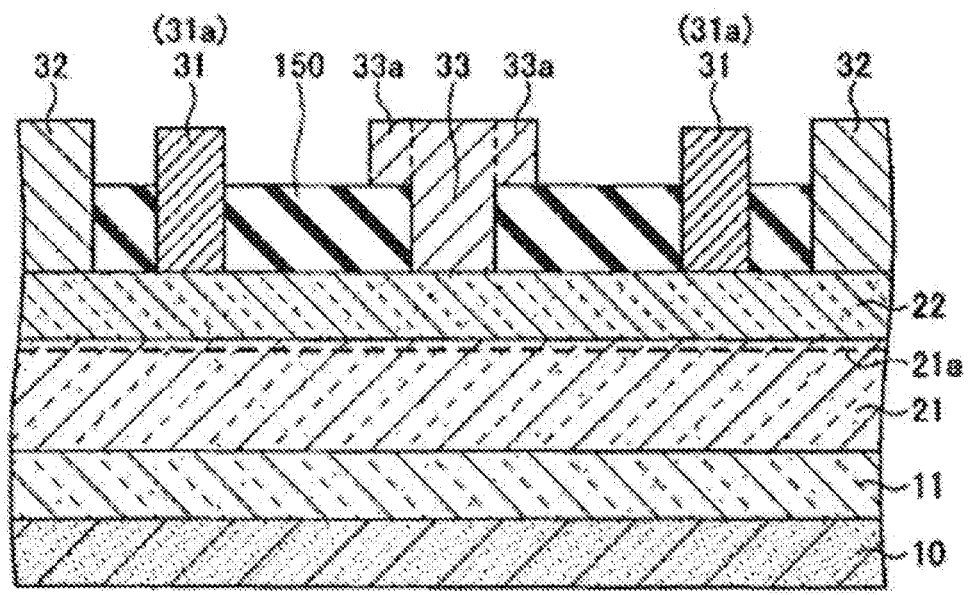
FIGS. 13A and 13B are cross sectional views of the semiconductor device in the second embodiment.
Figure 13B:
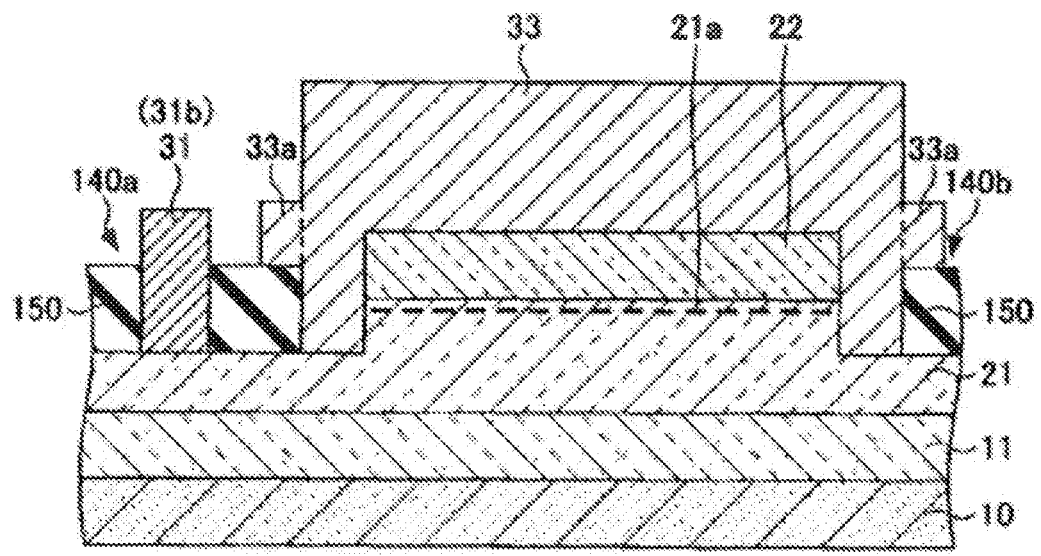

Next, a semiconductor device in this embodiment is described with reference to FIG. 12 and FIGS. 13A and 13B. FIG. 13A is a cross sectional view taken along the alternate long and short dash lines XIIIA-XIIIA in FIG. 12. FIG. 13B is a cross sectional view taken along the alternate long and short dash lines XIIIB-XIIIB in FIG. 12.

In a HEMT which is the semiconductor device in this embodiment, a buffer layer 11 is formed on a Si substrate 10 or the like and, on the buffer layer 11, an electron transit layer 21 which is a first semiconductor layer and an electron supply layer 22 which is a second semiconductor layer are stacked. The buffer layer 11 is formed of AlN, AlGaN, or the like. The electron transit layer 21 is formed of i-GaN or the like. The electron supply layer 22 is formed of i-AlGaN or the like. Thus, a 2DEG 21a is generated in the electron transit layer 21 near the interface between the electron transit layer 21 and the electron supply layer 22.

By partially removing the electron supply layer 22 and the electron transit layer 21 by dry etching or the like, element isolation regions 140a and 140b are formed, and element isolation is achieved by the element isolation regions 140a and 140b thus formed.

On the electron supply layer 22, gate fingers 31a of a gate electrode 31, source electrodes 32, and a drain electrode 33 are formed. Specifically, the drain electrode 33 is formed in the central portion and the source electrode 32 is formed at each of both sides of the drain electrode 33. More specifically, the drain electrode 33 is formed between the two source electrodes 32. The gate fingers 31a which form a part of the gate electrode 31 are each formed between the drain electrode 33 and the source electrodes 32. The gate electrode 31 has the two gate fingers 31a thus formed and a gate finger connection portion 31b for connecting the two gate fingers 31a. The source electrodes 32 and the drain electrode 33 are formed in a thin and long rectangular shape and are formed in such a manner that the longitudinal directions are almost the same direction.

In this embodiment, the drain electrode 33 has a drain field plate 33a whose upper portion projects in all directions around at the end portions of the drain electrode 33. For example, the drain field plate 33a is formed on an insulating layer 150 formed on the electron supply layer 22 around the drain electrode 33. In this embodiment, the drain field plate 33a is provided also at an end portion of the drain electrode 33 on the element isolation region 140a.

The gate fingers 31a of the gate electrode 31, the source electrodes 32, and the drain electrode 33 formed on the electron supply layer 22 are formed in such a manner as to extend from above one element isolation region 140a to above the other element isolation region 140b. The gate finger connection portion 31b of the gate electrode 31 is formed on the element transit layer 21 which is on one element isolation region 140a.

In the semiconductor device in this embodiment, by providing the drain field plate 33a described above, breakdown occurring at the end portions of the drain electrode 33 may be suppressed also in the case where a high voltage is applied to the drain electrode 33.

Method for Manufacturing Semiconductor Device

Next, a method for manufacturing the semiconductor device in this embodiment is described with reference to FIGS. 14 to 19.

Figure 14A:
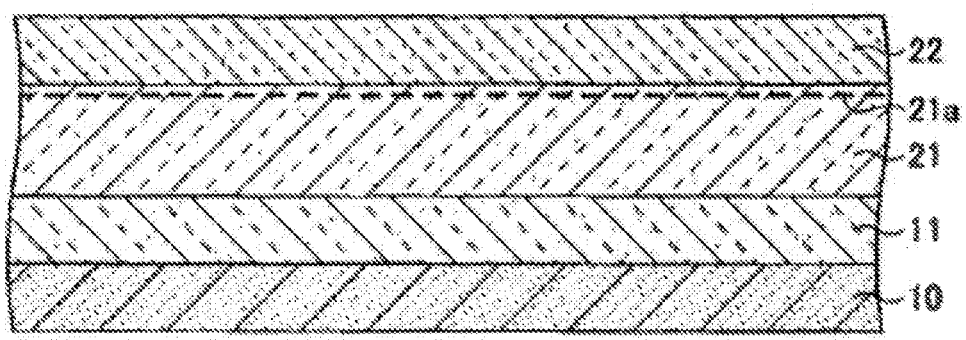
FIGS. 14A and 14B are drawings (1) of processes of a method for manufacturing the semiconductor device in the second embodiment.
Figure 14B:
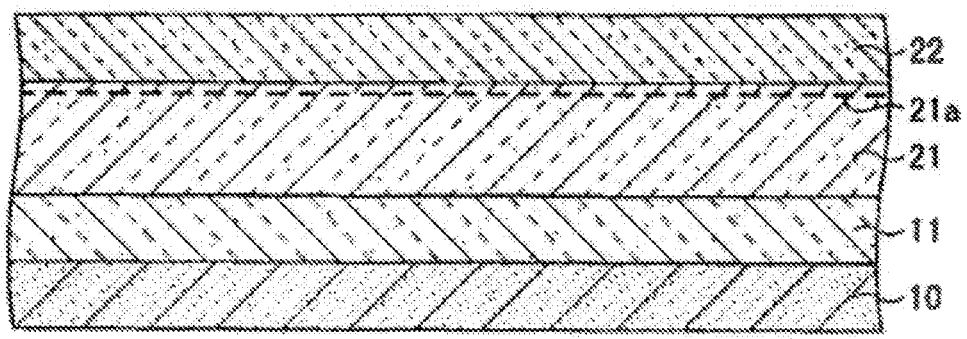

First, as illustrated in FIGS. 14A and 14B, the buffer layer 11, the electron transit layer 21, and the electron supply layer 22 are formed of a nitride semiconductor by epitaxial growth on the substrate 10 formed of Si or the like. FIG. 14A is a drawing corresponding to the cross section taken along the alternate long and short dash lines XIVA-XIVA in FIG. 12. FIG. 14B is a drawing corresponding to the cross section taken along the alternate long and short dash lines XIVB-XIVB in FIG. 12.

The substrate 10 may be one formed of SiC, sapphire, GaN, or the like other than Si. The buffer layer 11, the electron transit layer 21, and the electron supply layer 22 may be formed by epitaxial growth by MOCVD or MBE. In this embodiment, the case of MOCVD is described.

The buffer layer 11 is formed of AlN, AlGaN, or the like. As a source gas when forming the buffer layer 11, trimethyl aluminum (TMA), trimethyl gallium (TMG), and ammonia (NH$_3$) are used. The buffer layer 11 is formed by supplying a predetermined amount of the source gases into a MOCVD chamber, and then epitaxially growing the same.

The electron transit layer 21 is formed of GaN having a film thickness of about 1 μm. As a source gas when forming the electron transit layer 21, TMG and ammonia are used and the electron transit layer 21 is formed by supplying a predetermined amount of the source gases into a MOCVD chamber, and then epitaxially growing the same.

The electron supply layer 22 is formed of Al$_{0.2}$Ga$_{0.8}$N having a film thickness of about 20 nm. As a source gas when forming the electron supply layer 22, TMA, TMG, and ammonia are used and the electron supply layer 22 is formed by supplying a predetermined amount of the source gases into a MOCVD chamber, and then epitaxially growing the same. Thus, a 2DEG 21a is generated in the electron transit layer 21 near the interface between the electron transit layer 21 and the electron supply layer 22.

Figure 15A:
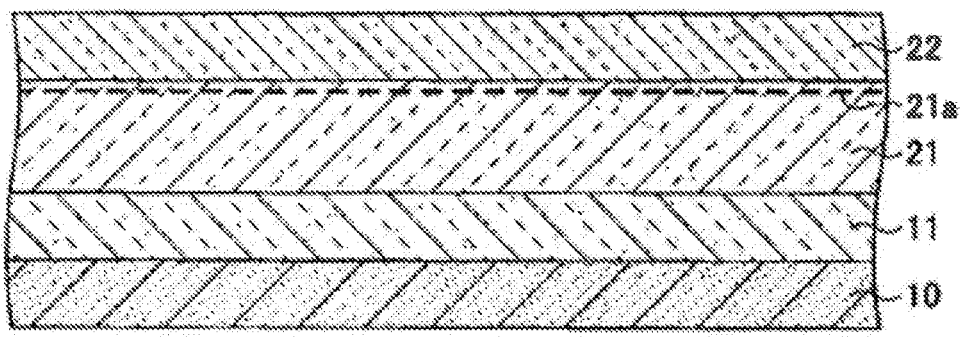
FIGS. 15A and 15B are drawings (2) of processes of the method for manufacturing the semiconductor device in the second embodiment.
Figure 15B:
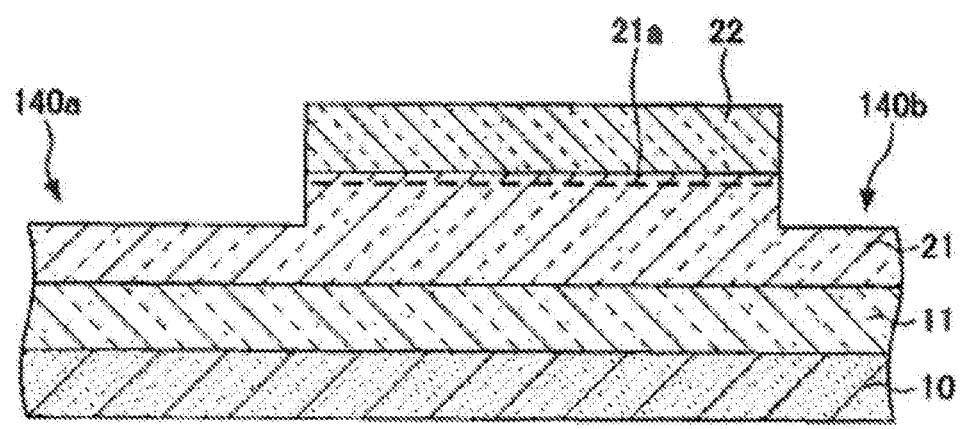

Next, as illustrated in FIGS. 15A and 15B, the element isolation regions 140a and 140b are formed in a part of the electron supply layer 22 and the electron transit layer 21. FIG. 15A is a drawing corresponding to the cross section taken along the alternate long and short dash lines XVA-XVA in FIG. 12. FIG. 15B is a drawing corresponding to the cross section taken along the alternate long and short dash lines XVB-XVB in FIG. 12.

Specifically, a resist pattern (not illustrated) having opening portions in regions where the element isolation regions 140a and 140b are to be formed is formed on the electron supply layer 22 by applying a photoresist, and then performing exposure by an exposure device and development. Thereafter, the electron supply layer 22 and the electron transit layer 21 are partially removed by dry etching, such as RTE. Thus, the element isolation regions 140a and 140b are formed by partially removing the electron supply layer 22 and the electron transit layer 21. Thereafter, the resist pattern (not illustrated) is removed with an organic solvent or the like.

Figure 16A:
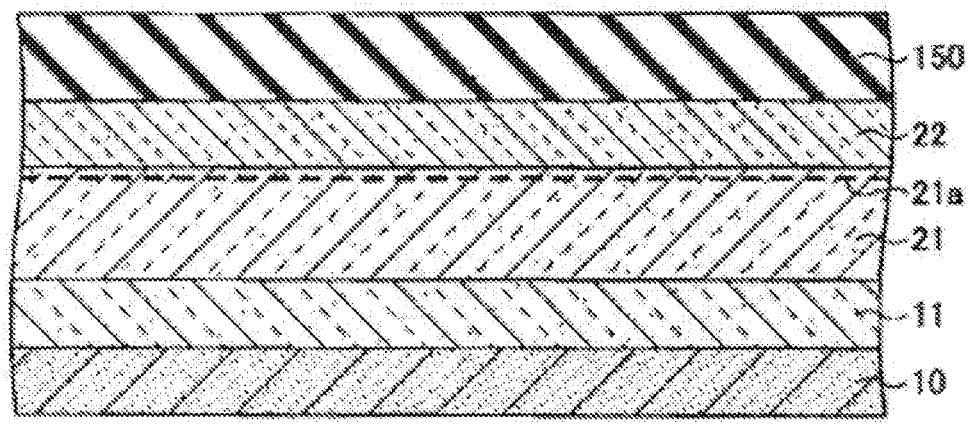
FIGS. 16A and 16B are drawings (3) of processes of the method for manufacturing the semiconductor device in the second embodiment.
Figure 16B:
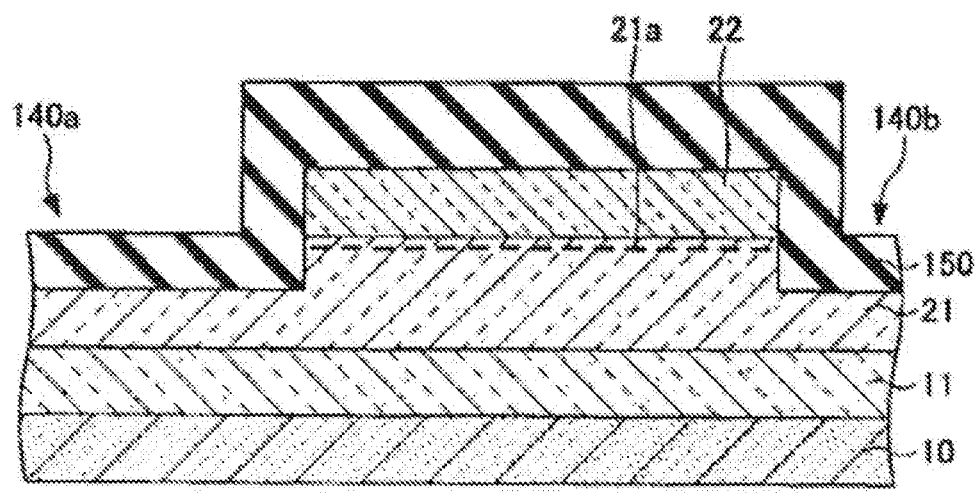

Next, as illustrated in FIG. 16, the insulating layer 150 is formed on the electron supply layer 22. Specifically, the insulating layer 150 is formed on the electron supply layer 22 by forming SiN (silicon nitride) into a film having a thickness of about 100 nm by CVD. Thus, by forming the insulating layer 150, the insulating layer 150 is embedded in the element isolation regions 140a and 140b. FIG. 16A is a drawing corresponding to the cross section taken along the alternate long and short dash lines XVIA-XVIA in FIG. 12. FIG. 16B is a drawing corresponding to the cross section taken along the alternate long and short dash lines XVIB-XVIB in FIG. 12.

Figure 17A:
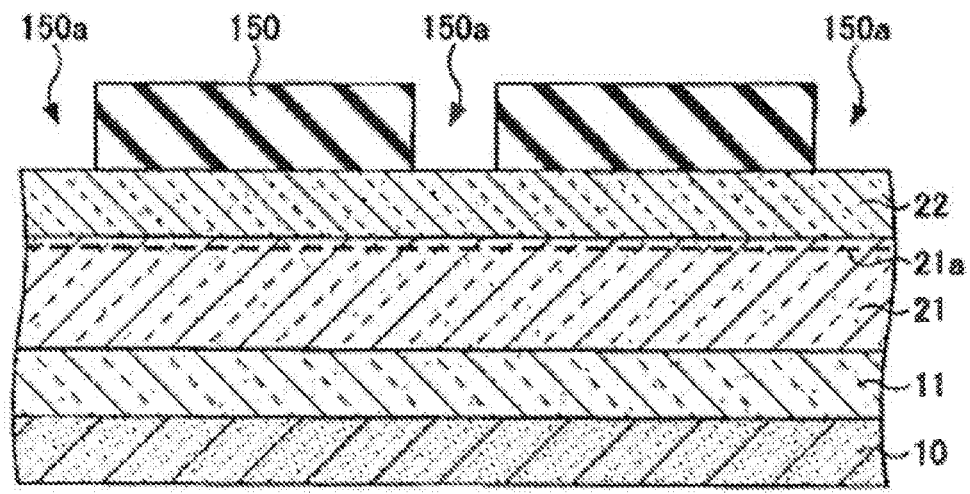
FIGS. 17A and 17B are drawings (4) of processes of the method for manufacturing the semiconductor device in the second embodiment.
Figure 17B:
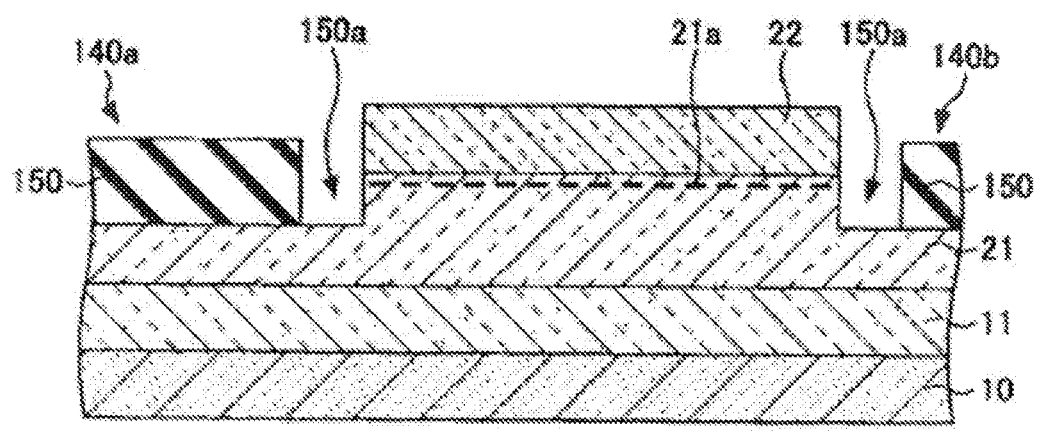

Next, as illustrated in FIGS. 17A and 17B, opening portions 150a are formed in regions where the source electrodes 32 and the drain electrode 33 are to be formed in the insulating layer 150. FIG. 17A is a drawing corresponding to the cross section taken along the alternate long and short dash lines XVIIA-XVIIA in FIG. 12. FIG. 17B is a drawing corresponding to the cross section taken along the alternate long and short dash lines XVIIB-XVIIB in FIG. 12.

Specifically, a resist pattern (not illustrated) having opening portions in regions where the source electrodes 32 and the drain electrode 33 are to be formed is formed on the insulating layer 150 by applying a photoresist, and then performing exposure by an exposure device and development. Thereafter, the insulating layer 150 in a region where the resist pattern is not formed is removed by dry etching, such as RIE, until the surface of the electron supply layer 22 is exposed. Thus, openings 150a are formed in the insulating layer 150 in the regions where the source electrodes 32 and the drain electrode 33 are to be formed. Thereafter, the resist pattern (not illustrated) is removed with an organic solvent or the like.

Figure 18A:
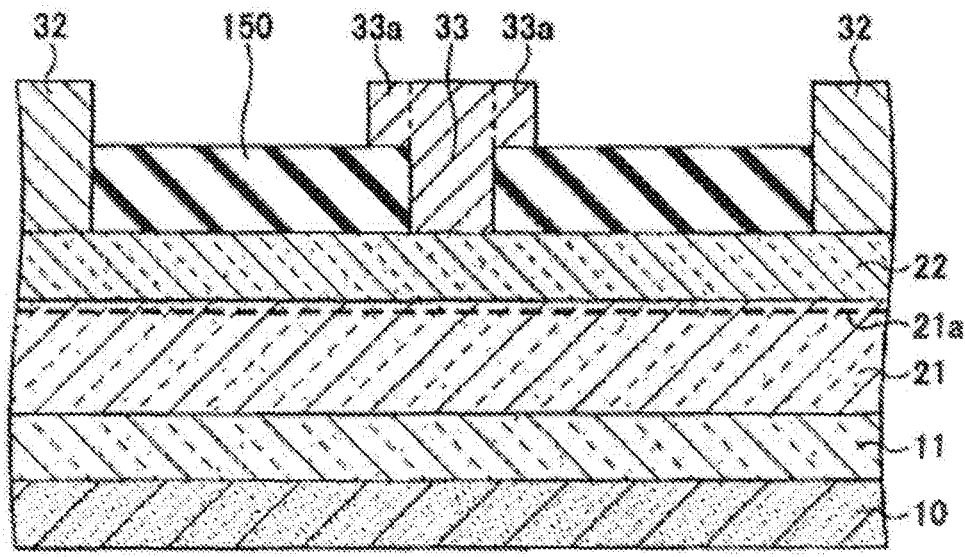
FIGS. 18A and 18B are drawings (5) of processes of the method for manufacturing the semiconductor device in the second embodiment.
Figure 18B:
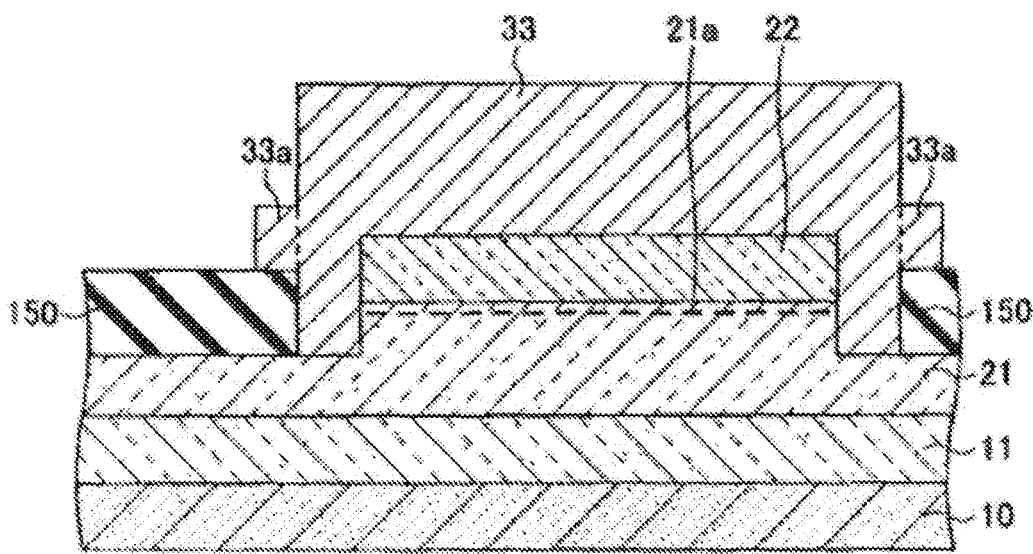

Next, as illustrated in FIGS. 18A and 18B, the source electrodes 32 and the drain electrode 33 are formed in the opening portions 150a in the insulating layer 150. FIG. 18A is a drawing corresponding to the cross section taken along the alternate long and short dash lines XVIIIA-XVIIIA in FIG. 12. FIG. 18B is a drawing corresponding to the cross section taken along the alternate long and short dash lines XVIIIB-XVIIIB in FIG. 12.

Specifically, a resist pattern (not illustrated) is formed by applying a photoresist to the surface of the insulating layer 150 and the electron supply layer 22, and then performing exposure by an exposure device and development again. The resist pattern formed in this case has opening portions in regions where the source electrodes 32, the drain electrode 33, and the drain field plate 33a are to be formed. Specifically, a resist pattern (not illustrated) having an opening portion larger than the opening portion 150a formed in the insulating layer 150 in order to form the drain electrode 33 is formed in a region where the drain electrode 33 is to be formed. Thereafter, a metal laminated film containing Ti/Al is formed by vacuum deposition, and then the film is immersed in an organic solvent or the like, whereby the metal laminated film formed on the resist pattern is removed by liftoff together with the resist pattern. Thus, the source electrodes 32 and the drain electrode 33 are formed with the remaining metal laminated film. Around the drain electrode 33 thus formed, the drain field plate 33a is formed on the insulating layer 150. More specifically, in the drain electrode 33, an upper portion is formed to be wider than a lower portion contacting the electron supply layer 22 and a portion formed on the insulating layer 150 in the upper portion of the drain electrode 33 becomes the drain field plate 33a. Thus, in this embodiment, the drain field plate 33a projecting in the upper portion is formed around the drain electrode 33. The metal laminated film containing Ti/Al here is formed by stacking a Ti film of about 100 nm and an Al film of about 300 nm. Thereafter, by performing RTA at a temperature of about 600° C., the source electrodes 32 and the drain electrode 33 are brought into ohmic contact with each other.

Figure 19A:
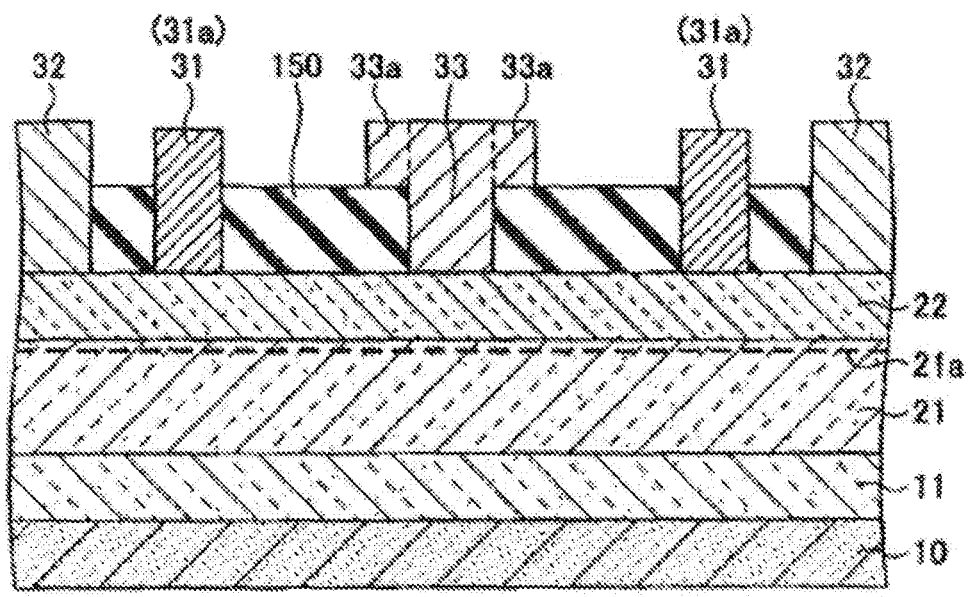
FIGS. 19A and 19B are drawings (6) of processes of the method for manufacturing the semiconductor device in the second embodiment.
Figure 19B:
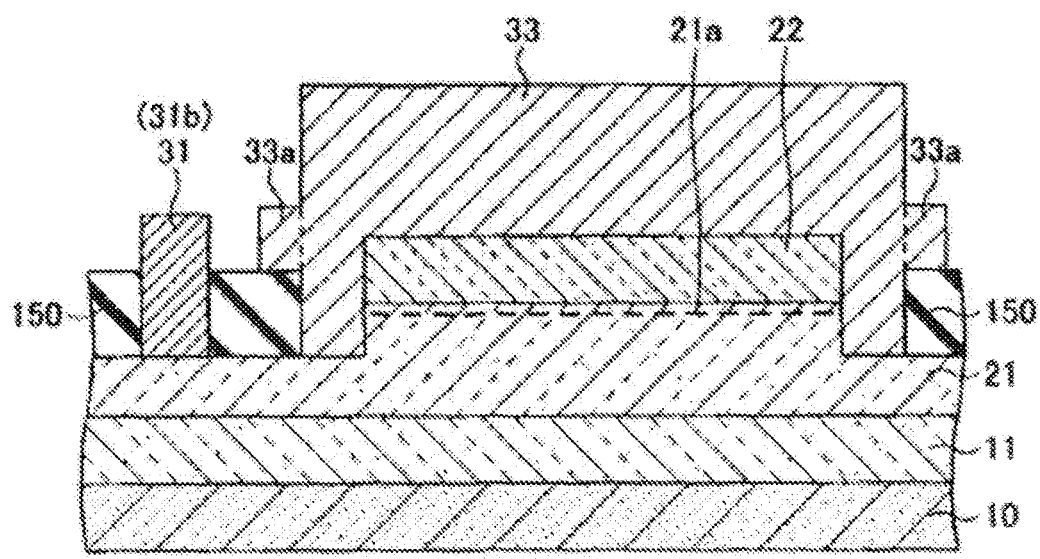

Next, as illustrated in FIGS. 19A and 19B, in the insulating layer 150, an opening portion is formed in a region where the gate electrode 31 is to be formed, and then the gate electrode 31 is formed in the formed opening portion. FIG. 19A is a drawing corresponding to the cross section taken along the alternate long and short dash lines XIXA-XIXA in FIG. 12. FIG. 19B is a drawing corresponding to the cross section taken along the alternate long and short dash lines XIXB-XIXB in FIG. 12.

Specifically, a resist pattern (not illustrated) having an opening portion in a region where the gate electrode 31 is to be formed is formed on the insulating layer 150 by applying a photoresist, and then performing exposure by an exposure device and development. Thereafter, the insulating layer 150 in a region where the resist pattern is not formed is removed by dry etching, such as RIE, until the surface of the electron supply layer 22 is exposed. In this case, a gate recess may be formed by partially removing the electron supply layer 22.

Thereafter, a metal laminated film containing Ni/Au is formed by vacuum deposition, and then the film is immersed in an organic solvent or the like, whereby the metal laminated film formed on the resist pattern is removed by liftoff together with the resist pattern. Thus, the gate electrode 31 is formed with the remaining metal laminated film. The gate electrode 31 thus formed has the gate fingers 31a formed between the source electrodes 32 and the drain electrode 33 and the gate finger connection portion 31b connecting the gate fingers 31a. The metal laminated film containing Ni/Au here is formed by stacking a Ni film of about 50 nm and an Au film of about 300 nm.

The semiconductor device in this embodiment may be manufactured by the above-described processes. The contents other than the contents described above are the same as those of the first embodiment.

Third Embodiment

Next, a third embodiment is described. This embodiment describes one having a structure in which element isolation regions are formed by etching.

Semiconductor Device

Figure 20:
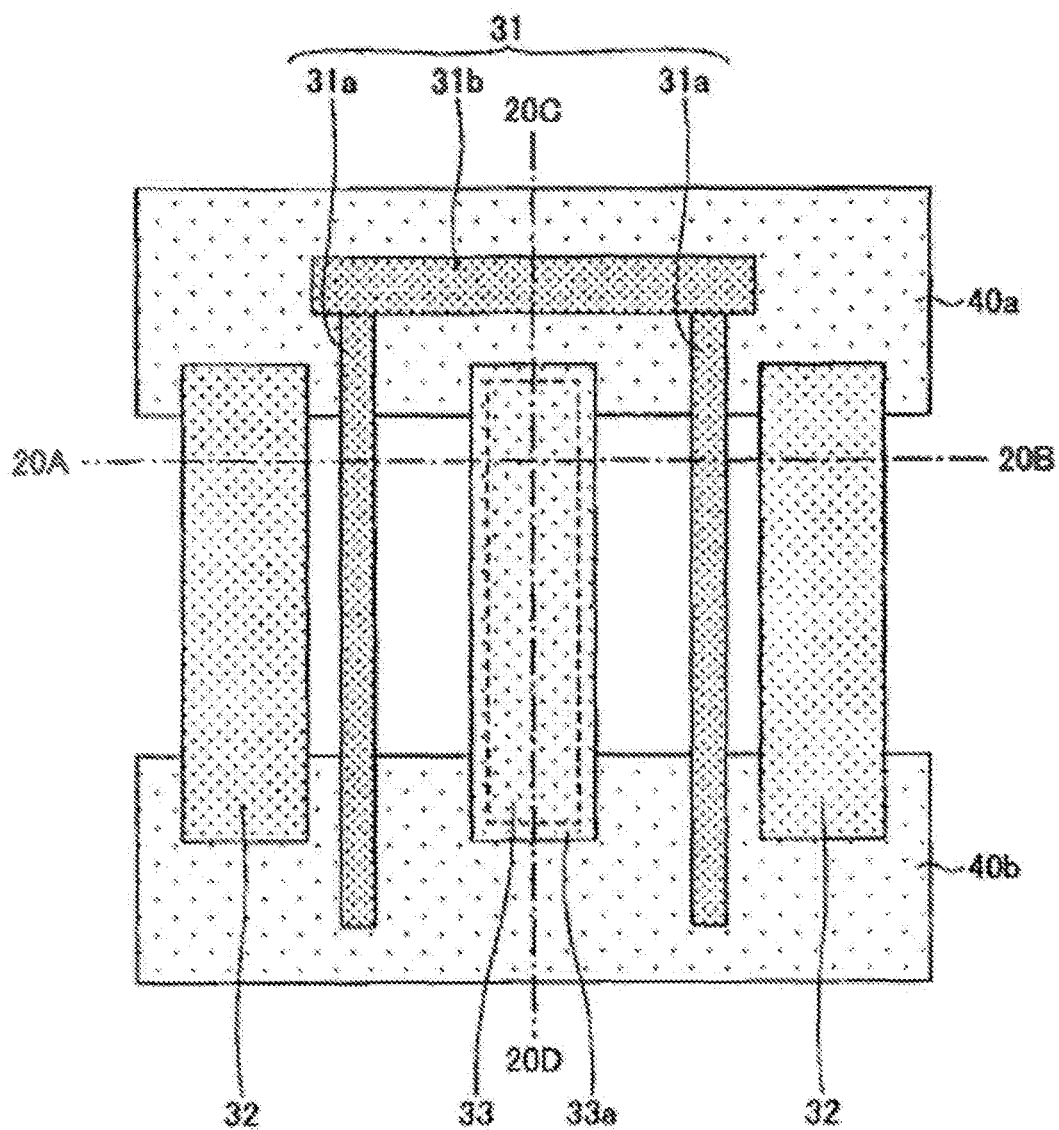
FIG. 20 is a top view of a semiconductor device in a third embodiment.
Figure 21A:
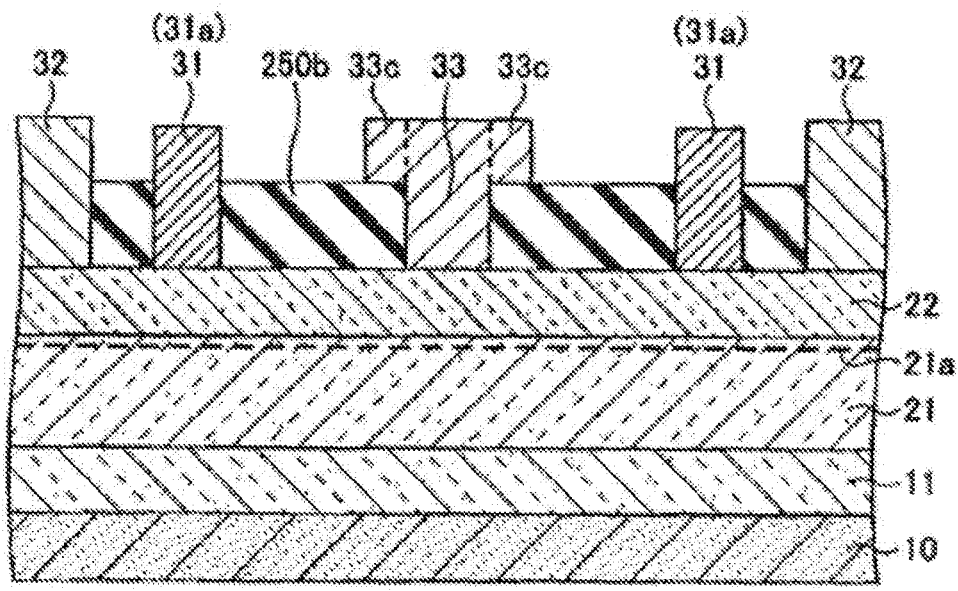
FIGS. 21A and 21B are cross sectional views of the semiconductor device in the third embodiment.
Figure 21B:
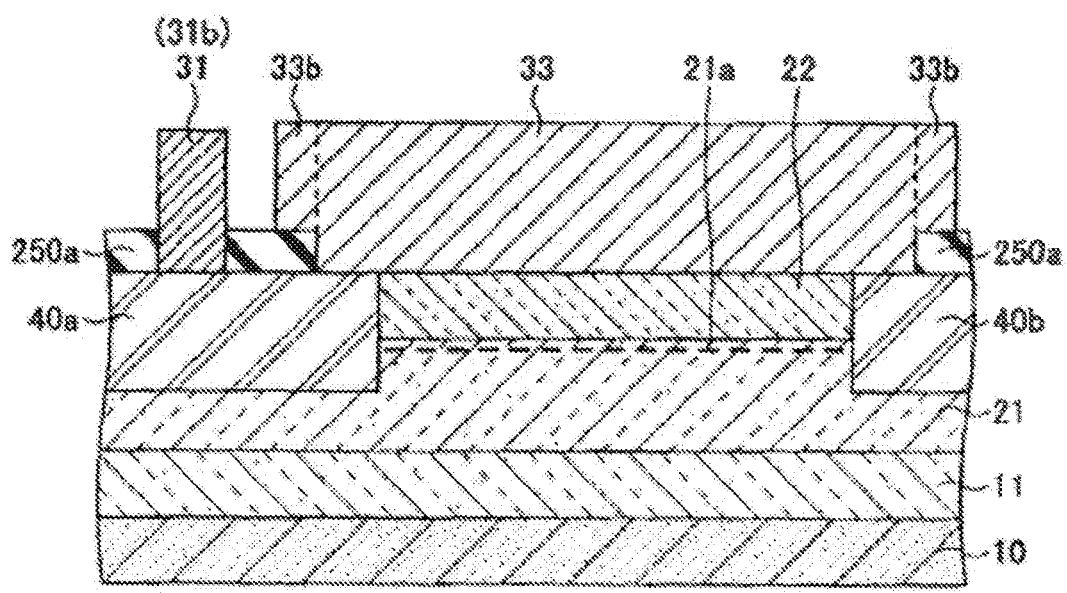

A semiconductor device in this embodiment is described with reference to FIG. 20 and FIGS. 21A and 21B. FIG. 21A is a cross sectional view taken along the alternate long and short dash lines XXIA-XXIA in FIG. 20. FIG. 21B is a cross sectional view taken along the alternate long and short dash lines XXIB-XXIB in FIG. 20.

In a HEMT which is the semiconductor device in this embodiment, a buffer layer 11 is formed on a Si substrate 10 or the like and, on the buffer layer 11, an electron transit layer 21 which is a first semiconductor layer and an electron supply layer 22 which is a second semiconductor layer are stacked. The buffer layer 11 is formed of AlN, AlGaN, or the like. The electron transit layer 21 is formed of i-GaN or the like. The electron supply layer 22 is formed of i-AlGaN or the like. Thus, a 2DEG 21a is generated in the electron transit layer 21 near the interface between the electron transit layer 21 and the electron supply layer 22.

By performing ion implantation of Ar or the like, element isolation regions 40a and 40b are formed in a part of the electron supply layer 22 and the electron transit layer 21, and element isolation is achieved by the element isolation regions 40a and 40b thus formed.

On the electron supply layer 22, a gate electrode 31, source electrodes 32, and a drain electrode 33 are formed. Specifically, the drain electrode 33 is formed in the central portion and the source electrode 32 is formed at each of both sides of the drain electrode 33. More specifically, the drain electrode 33 is formed between the two source electrodes 32. The gate fingers 31a which form a part of the gate electrode 31 are each formed between the drain electrode 33 and the source electrodes 32. The gate electrode 31 has the two gate fingers 31a thus formed and a gate finger connection portion 31b for connecting the two gate fingers 31a. The source electrodes 32 and the drain electrode 33 are formed in a thin and long rectangular shape and are formed in such a manner that the longitudinal directions are almost the same direction.

In this embodiment, the drain electrode 33 has drain field plates 33b and 33c whose upper portions project in all directions around at the end portions of the drain electrode 33. Specifically, the drain field plates 33b and 33c are provided on an insulating layer 250 formed on the electron supply layer 22. Therefore, the drain field plate 33b is formed also at an end portion of the drain electrode 33 on the element isolation region 40a.

In this embodiment, the insulating layer 250 includes an insulating layer 250a formed on the element isolation regions 40a and 40b and an insulating layer 250b formed on the electron supply layer 22 in regions other than the element isolation region 40a and 40b. Furthermore, the insulating layer 250a formed on the element isolation regions 40a and 40b is formed to be thinner than the insulating layer 250b formed on the electron supply layer 22 in the regions other than the element isolation region 40a and 40b. Specifically, the insulating layer 250a has a film thickness equal to or less than the half of the film thickness of the insulating layer 250b and, for example, the film thickness of the insulating layer 250a is about 50 nm and the film thickness of the insulating layer 250b is about 100 nm. Therefore, in the element isolation region 40a, since the drain field plate 33b is formed on the insulating layer 250a thinner than the insulating layer 250b, the drain field plate 33b is formed at a position lower than the position of the drain field plate 33c. Thus, by reducing the thickness of the insulating layer 250a, an electric field may be further moderated. On the other hand, in the regions where the element isolation regions 40a and 40b are not formed, the drain field plate 33c is desired to be formed at a higher position in order to reduce collapse, and thus the thickness of the insulating layer 250b may be increased to some extent.

The gate fingers 31a of the gate electrode 31, the source electrodes 32, and the drain electrode 33 formed on the electron supply layer 22 are formed in such a manner as to extend from above one element isolation region 40a to above the other element isolation region 40b. The gate finger connection portion 31b of the gate electrode 31 is formed on one element isolation region 40a.

Method for Manufacturing Semiconductor Device

Next, a method for manufacturing the semiconductor device in this embodiment is described with reference to FIGS. 22 to 28.

Figure 22A:
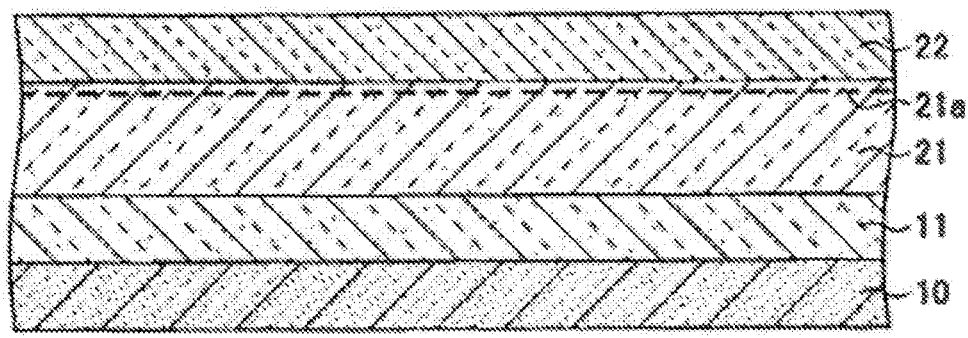
FIGS. 22A and 22B are drawings (1) of processes of a method for manufacturing the semiconductor device in the third embodiment.
Figure 22B:
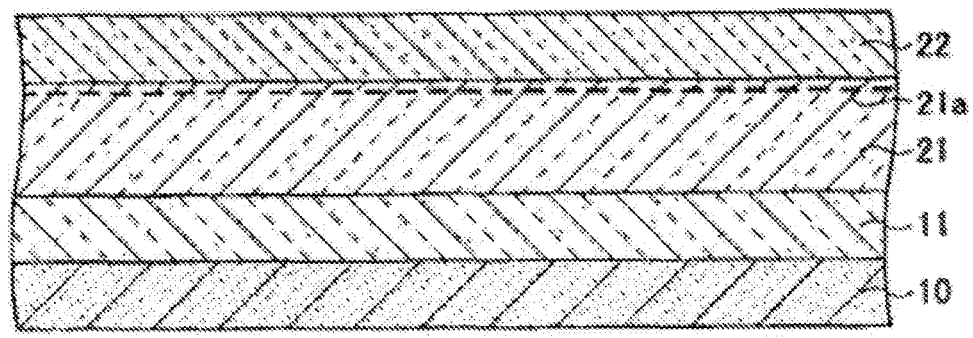

First, as illustrated in FIGS. 22A and 22B, the buffer layer 11, the electron transit layer 21, and the electron supply layer 22 are formed of a nitride semiconductor by epitaxial growth on the substrate 10 formed of Si or the like. FIG. 22A is a drawing corresponding to the cross section taken along the alternate long and short dash lines XXIIA-XXIIA in FIG. 20. FIG. 22B is a drawing corresponding to the cross section taken along the alternate long and short dash lines XXIIB-XXIIB in FIG. 20.

The substrate 10 may be one formed of SiC, sapphire, GaN, or the like other than Si. The buffer layer 11, the electron transit layer 21, and the electron supply layer 22 may be formed by epitaxial growth by MOCVD or MBE. In this embodiment, the case of MOCVD is described.

The buffer layer 11 is formed of AlN, AlGaN, or the like. As a source gas when forming the buffer layer 11, trimethyl aluminum (TMA), trimethyl gallium (TMG), and ammonia ($NH_3$) are used. The buffer layer 11 is formed by supplying a predetermined amount of the source gases into a MOCVD chamber, and then epitaxially growing the same.

The electron transit layer 21 is formed of GaN having a film thickness of about 1 μm. As a source gas when forming the electron transit layer 21, TMG and ammonia are used and the electron transit layer 21 is formed by supplying a predetermined amount of the source gases into a MOCVD chamber, and then epitaxially growing the same.

The electron supply layer 22 is formed of $Al_{0.2}Ga_{0.8}N$ having a film thickness of about 20 nm. As a source gas when forming the electron supply layer 22, TMA, TMG, and ammonia are used and the electron supply layer 22 is formed by supplying a predetermined amount of the source gases into a MOCVD chamber, and then epitaxially growing the same. Thus, a 2DEG 21a is generated in the electron transit layer 21 near the interface between the electron transit layer 21 and the electron supply layer 22.

Figure 23A:
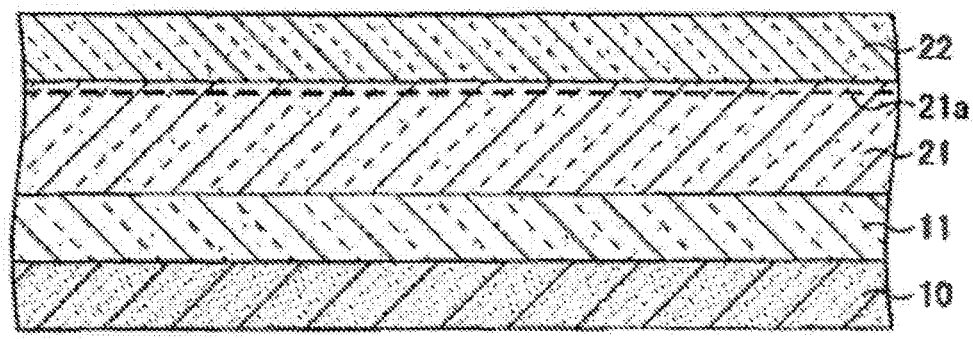
FIGS. 23A and 23B are drawings (2) of processes of the method for manufacturing the semiconductor device in the third embodiment.
Figure 23B:
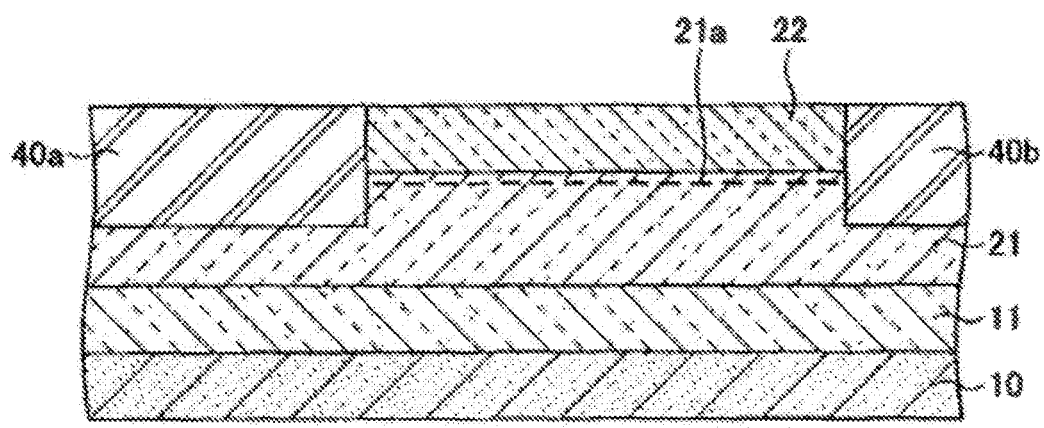

Next, as illustrated in FIGS. 23A and 23B, the element isolation regions 40a and 40b are formed in a part of the electron supply layer 22 and the electron transit layer 21. FIG. 23A is a drawing corresponding to the cross section taken along the alternate long and short dash lines XXIIIA-XXIIIA in FIG. 20. FIG. 23B is a drawing corresponding to the cross section taken along the alternate long and short dash lines XXIIIB-XXIIIB in FIG. 20.

Specifically, a resist pattern (not illustrated) having opening portions in regions where the element isolation regions 40a and 40b are to be formed is formed on the electron supply layer 22 by applying a photoresist, and then performing exposure by an exposure device and development. Thereafter, an inactive region is formed by ion implantation of ions, such as argon (Ar), into a part of the electron supply layer 22 and the electron transit layer 21 in the opening portion where the resist pattern is not formed, to be semi-insulated. By the inactive region thus formed, the element isolation regions 40a and 40b are formed. Thereafter, the resist pattern (not illustrated) is removed with an organic solvent or the like. Examples of elements capable of forming the inactive region by ion implantation include, in addition to Ar, hydrogen (H), helium (He), nitrogen (N), fluorine (F), magnesium (Mg), zinc (Zn), oxygen (O), and the like.

Figure 24A:
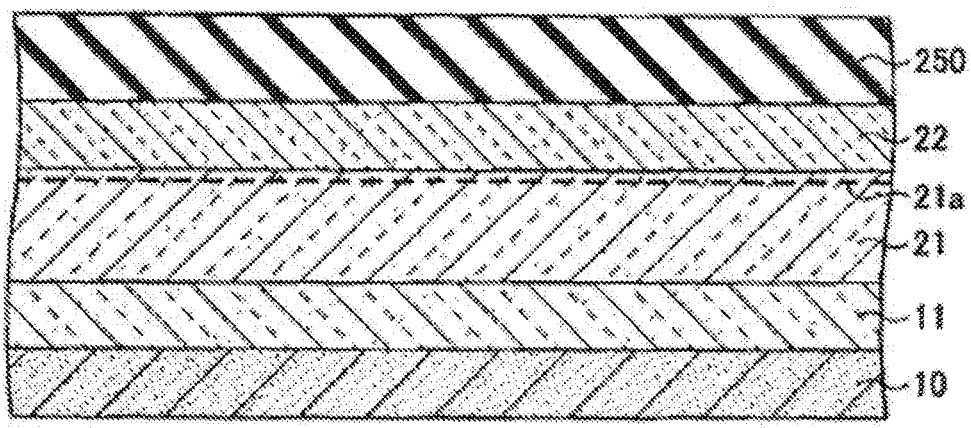
FIGS. 24A and 24B are drawings (3) of processes of the method for manufacturing the semiconductor device in the third embodiment.
Figure 24B:
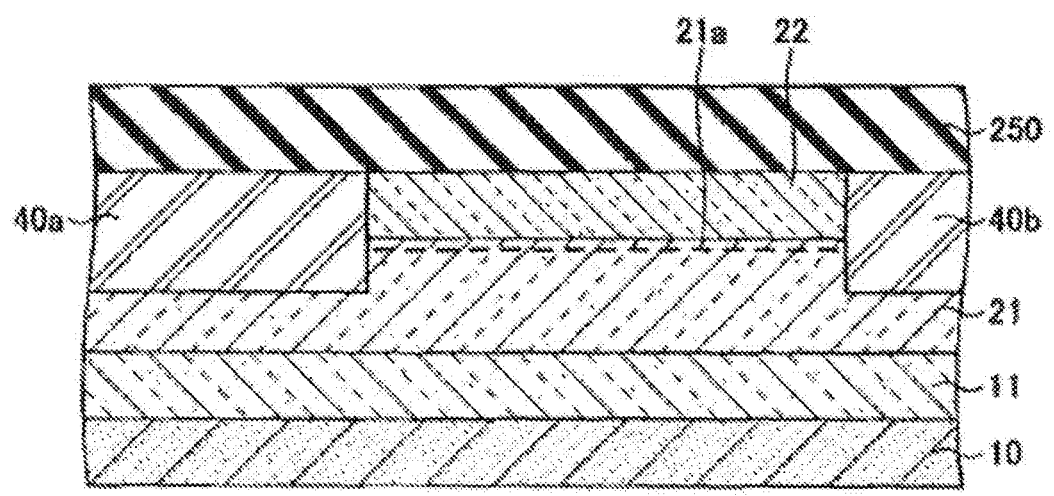

Next, as illustrated in FIGS. 24A and 24B, the insulating layer 250 is formed on the electron supply layer 22. Specifically, the insulating layer 250 is formed on the electron supply layer 22 by forming SiN (silicon nitride) into a film having a thickness of about 100 nm by CVD. FIG. 24A is a drawing corresponding to the cross section taken along the alternate long and short dash lines XXIVA-XXIVA in FIG. 20. FIG. 24B is a drawing corresponding to the cross section taken along the alternate long and short dash lines XXIVB-XXIVB in FIG. 20.

Figure 25A:
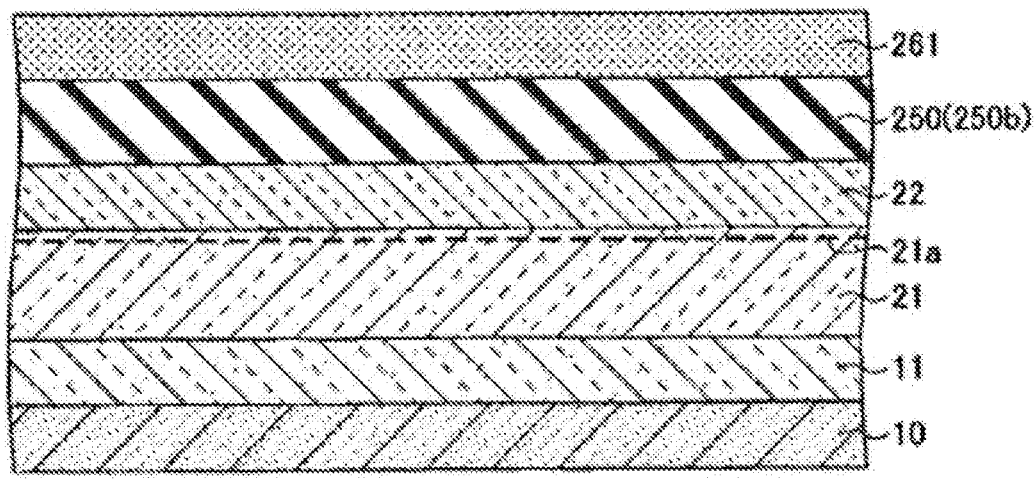
FIGS. 25A and 25B are drawings (4) of processes of the method for manufacturing the semiconductor device in the third embodiment.
Figure 25B:
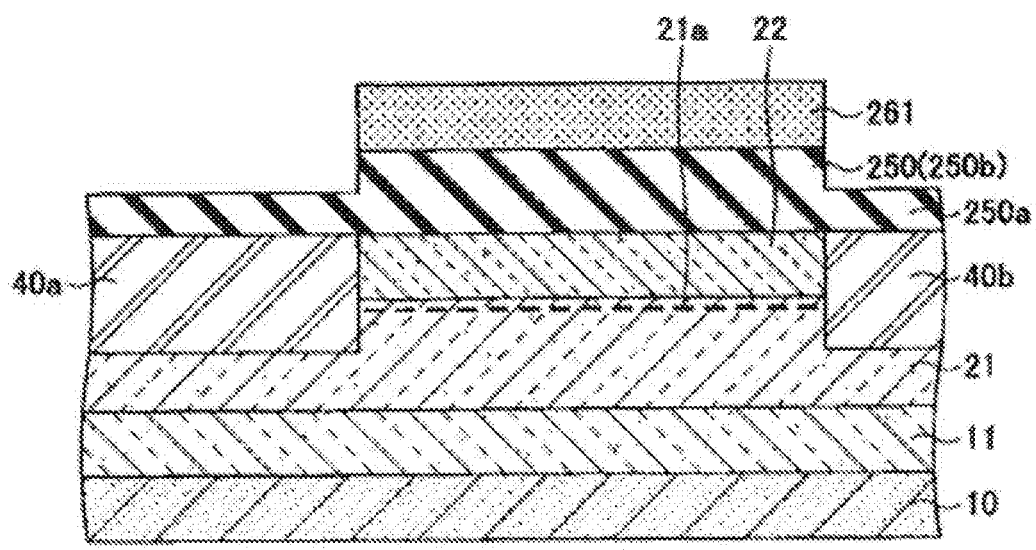

Next, as illustrated in FIGS. 25A and 25B, the insulating layer 250a is formed on the element isolation regions 40a and 40b by forming a resist pattern 261 in a region other than the region above the element isolation regions 40a and 40b, and then reducing the thickness of the insulating layer 250 on the element isolation regions 40a and 40b. FIG. 25A is a drawing corresponding to the cross section taken along the alternate long and short dash lines XXVA-XXVA in FIG. 20. FIG. 25B is a drawing corresponding to the cross section taken along the alternate long and short dash lines XXVB-XXVB in FIG. 20.

Specifically, a photoresist is applied onto the insulating layer 250, and then performing exposure by an exposure device and development to form the resist pattern 261 having opening portions on the element isolation regions 40a and 40b through the insulating layer 250. Thereafter, by performing dry etching by RIE or the like using etching gas containing fluorine, the insulating layer 250 in a region where the resist pattern 261 is not formed is removed until the thickness of the insulating layer 250 is about 50 nm to form the insulating layer 250a. In the insulating layer 250, the insulating layer in a region other than the insulating layer 250a is sometimes referred to as the insulating layer 250b. Thereafter, the resist pattern (not illustrated) is removed with an organic solvent or the like.

Figure 26A:
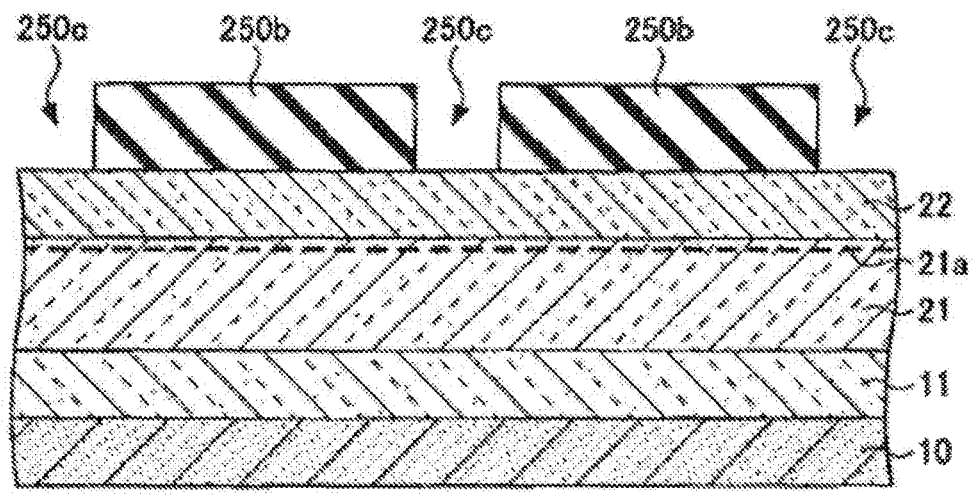
FIGS. 26A and 26B are drawings (5) of processes of the method for manufacturing the semiconductor device in the third embodiment.
Figure 26B:
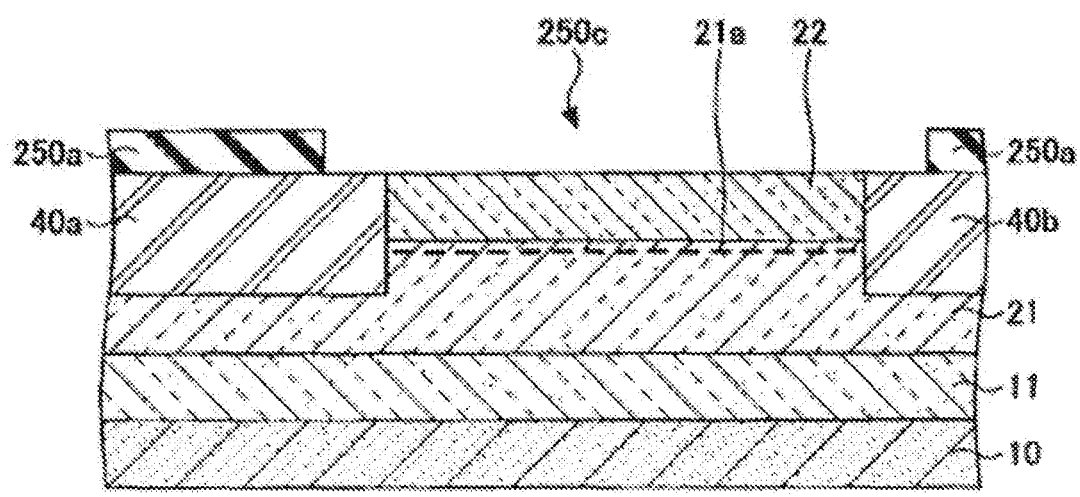

Next, as illustrated in FIGS. 26A and 26B, opening portions 250c are formed in regions where the source electrodes 32 and the drain electrode 33 are to be formed in the insulating layer 250. FIG. 26A is a drawing corresponding to the cross section taken along the alternate long and short dash lines XXVIA-XXVIA in FIG. 20. FIG. 26B is a drawing corresponding to the cross section taken along the alternate long and short dash lines XXVIB-XXVIB in FIG. 20.

Specifically, a resist pattern (not illustrated) having opening portions in regions where the source electrodes 32 and the drain electrode 33 are to be formed is formed on the insulating layer 250 by applying a photoresist, and then performing exposure by an exposure device and development. Thereafter, the insulating layer 250 in a region where the resist pattern is not formed is removed by dry etching, such as RIE, until the surface of the electron supply layer 22 is exposed. Thus, the opening portions 250c are formed in the insulating layer 250 in the regions where the source electrodes 32 and the drain electrode 33 are to be formed. Thereafter, the resist pattern (not illustrated) is removed with an organic solvent or the like.

Figure 27A:
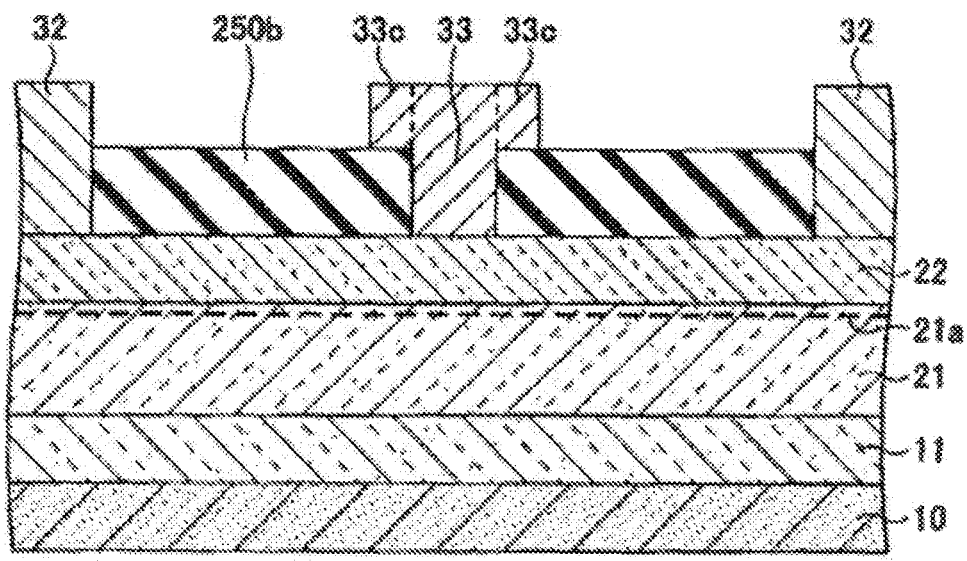
FIGS. 27A and 27B are drawings (6) of processes of the method for manufacturing the semiconductor device in the third embodiment.
Figure 27B:
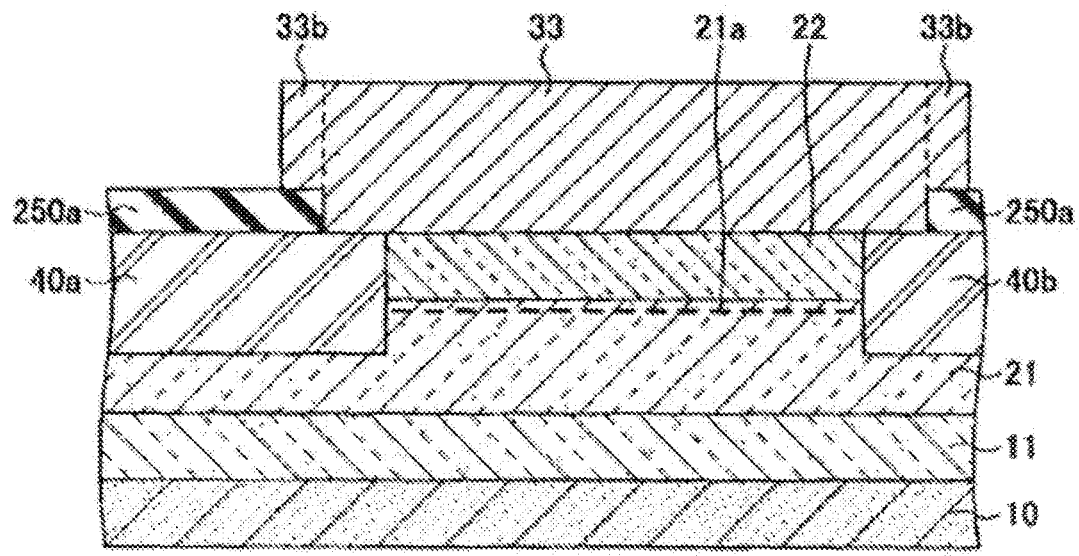

Next, as illustrated in FIGS. 27A and 27B, the source electrodes 32 and the drain electrode 33 are formed in the opening portions 250c in the insulating layer 250. FIG. 27A is a drawing corresponding to the cross section taken along the alternate long and short dash lines XXVIIA-XXVIIA in FIG. 20. FIG. 27B is a drawing corresponding to the cross section taken along the alternate long and short dash lines XXVIIB-XXVIIB in FIG. 20.

Specifically, a resist pattern (not illustrated) is formed by applying a photoresist to the surface of the insulating layer 250 and the electron supply layer 22, and then performing exposure by an exposure device and development again. The resist pattern formed here has opening portions in regions where the source electrodes 32, the drain electrode 33, and the drain field plates 33b and 33c are to be formed. Specifically, a resist pattern (not illustrated) having an opening portion larger than the opening portion 250c formed in the insulating layer 250 in order to form the drain electrode 33 is formed in a region where the drain electrode 33 is to be formed. Thereafter, a metal laminated film containing Ti/Al is formed by vacuum deposition, and then the film is immersed in an organic solvent or the like, whereby the metal laminated film formed on the resist pattern is removed by liftoff together with the resist pattern. Thus, the source electrodes 32 and the drain electrode 33 are formed with the remaining metal laminated film. Around the drain electrode 33 thus formed, the drain field plates 33b and 33c are formed on the insulating layer 250. More specifically, in the drain electrode 33, an upper portion is formed to be wider than a lower portion contacting the electron supply layer 22 and a portion formed on the insulating layer 250 in the upper portion of the drain electrode 33 becomes the drain field plates 33b and 33c.

In this embodiment, the drain field plate 33b is formed on the insulating layer 250a on the element isolation regions 40a and 40b. The drain field plate 33c is formed on the insulating layer 250b on a region except the element isolation regions 40a and 40b. The metal laminated film containing Ti/Al here is formed by stacking a Ti film of about 100 nm and an Al film of about 300 nm. Thereafter, by performing RTA at a temperature of about 600° C., the source electrode 32 and the drain electrode 33 are brought into ohmic contact with each other.

Figure 28A:
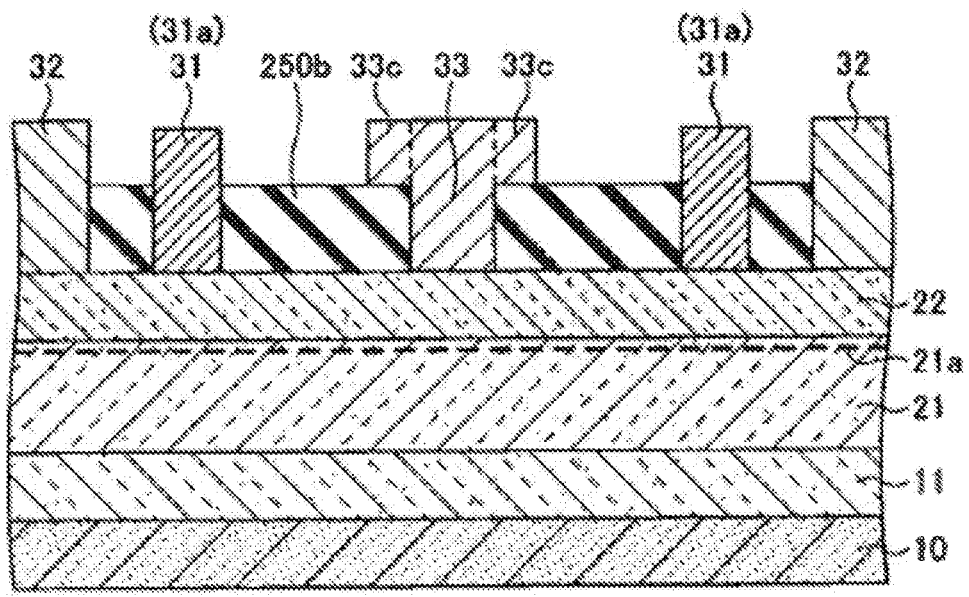
FIGS. 28A and 28B are drawings (7) of processes of the method for manufacturing the semiconductor device in the third embodiment.
Figure 28B:
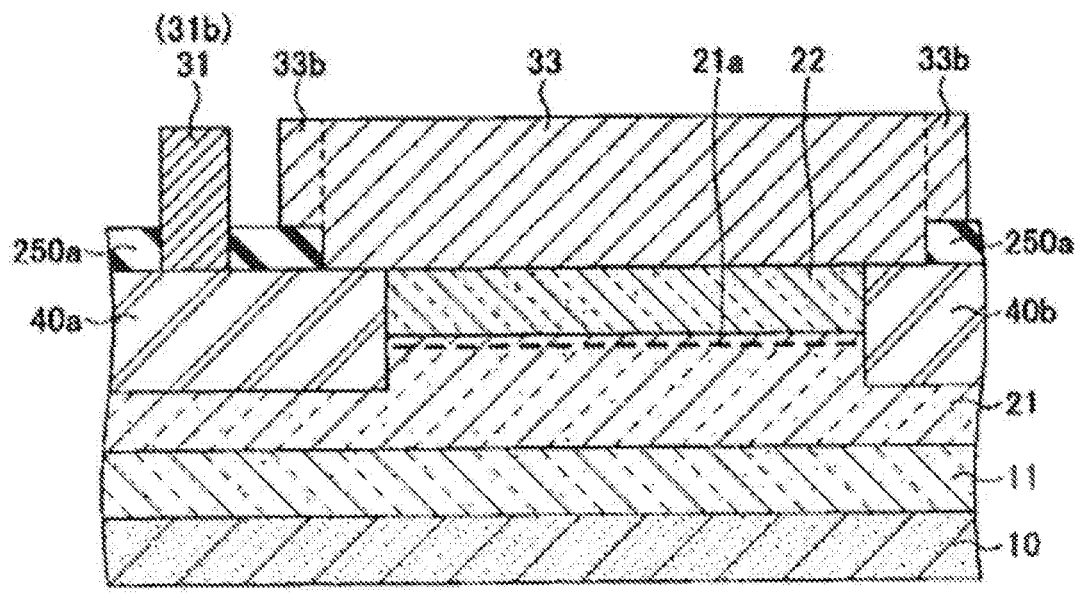

Next, as illustrated in FIGS. 28A and 28B, in the insulating layer 250, an opening portion is formed in a region where the gate electrode 31 is to be formed, and then the gate electrode 31 is formed in the formed opening portion. FIG. 28A is a drawing corresponding to the cross section taken along the alternate long and short dash lines XXVIIIA-XXVIIIA in FIG. 20. FIG. 28B is a drawing corresponding to the cross section taken along the alternate long and short dash lines XXVIIIB-XXVIIIB in FIG. 20.

Specifically, a resist pattern (not illustrated) having an opening portion in a region where the gate electrode 31 is to be formed is formed on the insulating layers 250a and 250b by applying a photoresist, and then performing exposure by an exposure device and development. Thereafter, the insulating layer 250b in a region where the resist pattern is not formed is removed by dry etching, such as RIE, until the surface of the electron supply layer 22 is exposed. In this case, a gate recess may be formed by partially removing the electron supply layer 22. Thereafter, a metal laminated film containing Ni/Au is formed by vacuum deposition, and then the film is immersed in an organic solvent or the like, whereby the metal laminated film formed on the resist pattern is removed by liftoff together with the resist pattern. Thus, the gate electrode 31 is formed with the remaining metal laminated film. The gate electrode 31 thus formed has the gate fingers 31a formed between the source electrodes 32 and the drain electrode 33 and a gate finger connection portion 31b connecting the gate fingers 31a. The metal laminated film containing Ni/Au here is formed by stacking a Ni film of about 50 nm and an Au film of about 300 nm.

The semiconductor device in this embodiment may be manufactured by the above-described processes. The contents other than the contents described above are the same as those of the first embodiment.

Fourth Embodiment

Next, a fourth embodiment is described. This embodiment describes a semiconductor device, a power unit, and a high-frequency amplifier.

Figure 29:
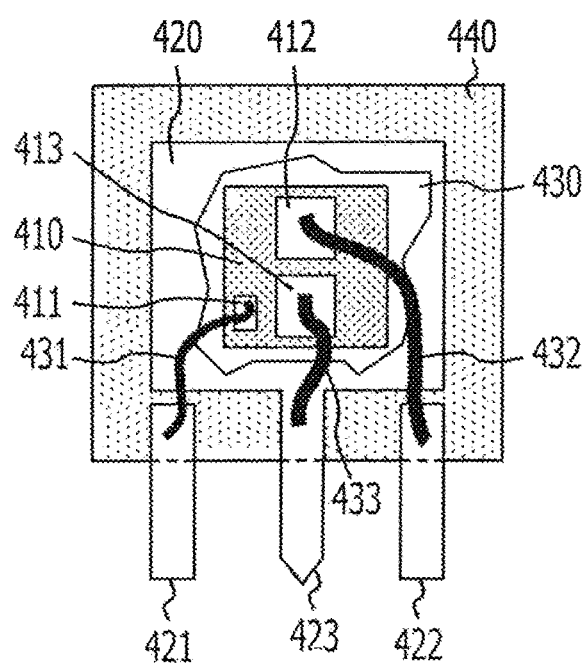
FIG. 29 is an explanatory view of a discrete-packaged semiconductor device in a fourth embodiment.

The semiconductor device in this embodiment is one obtained by discrete-packaging the semiconductor devices in the first to third embodiments. Such a discrete-packaged semiconductor device is described with reference to FIG. 29. FIG. 29 schematically illustrates the inside of the discrete-packaged semiconductor device and the arrangement of electrodes and the like are different from those described in the first to third embodiments.

First, the semiconductor devices manufactured in the first to third embodiments are cut by dicing or the like to form a HEMT semiconductor chip 410 containing a GaN semiconductor material. The semiconductor chip 410 is fixed onto a leadframe 420 with a die-attaching agent 430, such as solder.

Next, a gate electrode 411 is connected to a gate lead 421 by a bonding wire 431, a source electrode 412 is connected to a source lead 422 by a bonding wire 432, and a drain electrode 413 is connected to a drain lead 423 by a bonding wire 433. The bonding wires 431, 432, and 433 are formed of metal materials, such as Al. The gate electrode 411 in this embodiment is a gate electrode pad and is connected to the gate electrode 31 in the first to third embodiments. Similarly, the source electrode 412 is a source electrode pad and is connected to the source electrodes 32 and the drain electrode 413 is a drain electrode pad, and is connected to the drain electrode 33.

Next, plastic molding is performed with a mold resin 440 by a transfer mold method. Thus, a discrete-packaged HEMT semiconductor device containing a GaN semiconductor material may be produced.

Moreover, a power unit and a high-frequency amplifier in this embodiment are a power unit and a high-frequency amplifier employing any one of the semiconductor devices in the first to third embodiments.

Figure 30:
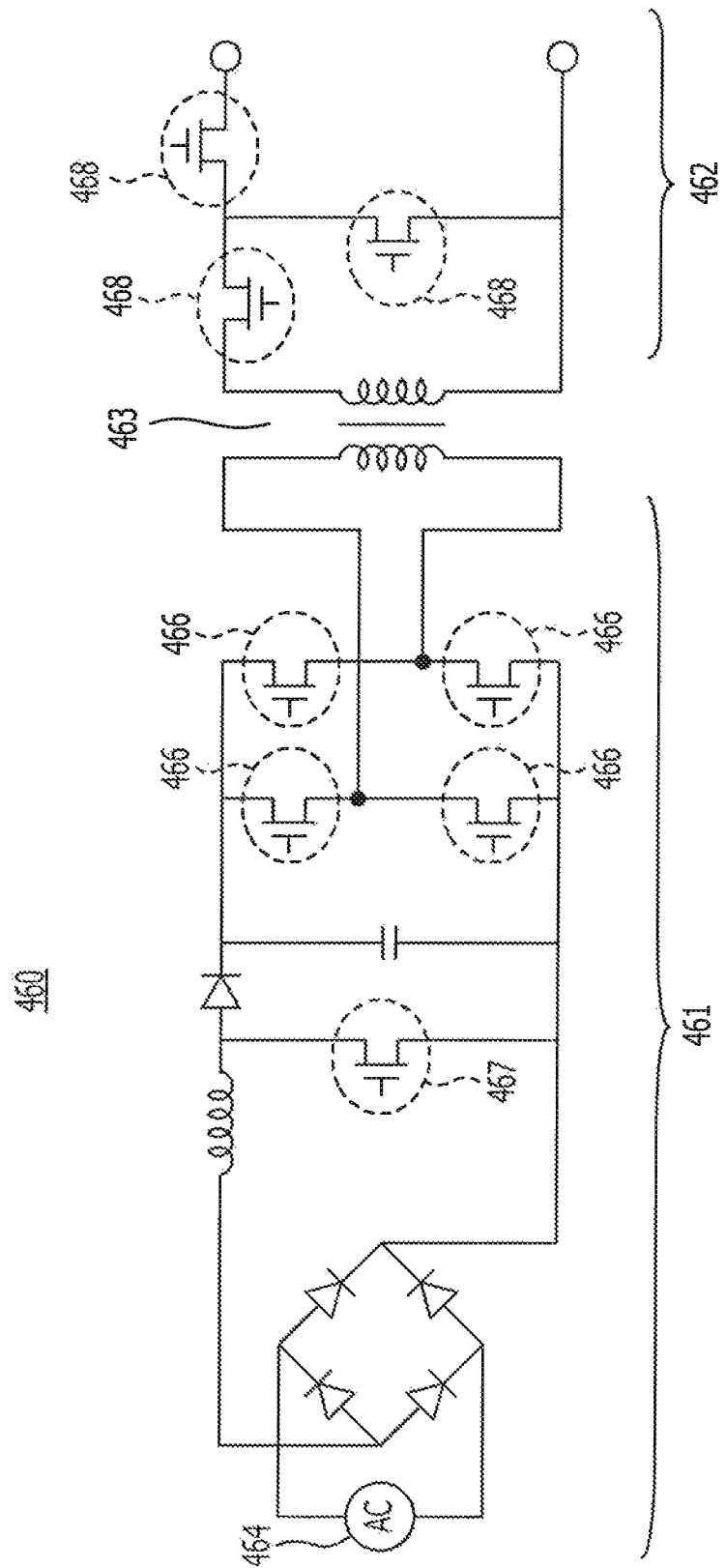
FIG. 30 is a circuit diagram of a power unit in the fourth embodiment.

The power unit in this embodiment is described with reference to FIG. 30. A power unit 460 in this embodiment has a high-voltage primary side circuit 461, a low-voltage secondary side circuit 462, and a transformer 463 disposed between the primary side circuit 461 and the secondary side circuit 462. The primary side circuit 461 has an alternating power supply 464, a so-called bridge rectifier circuit 465, a plurality of (four in the example illustrated in FIG. 30) switching elements 466, one switching element 467, and the like. The secondary side circuit 462 has a plurality of (three in the example illustrated in FIG. 30) switching elements 468. In the example illustrated in FIG. 30, the semiconductor devices in the first to third embodiments are used as the switching elements 466 and 467 of the primary side circuit 461. The switching elements 466 and 467 of the primary side circuit 461 are preferably normally-off semiconductor devices. The switching elements 468 used in the secondary side circuit 462 employ a common metal insulator semiconductor field effect transistor (MISFET) formed of silicon.

Figure 31:
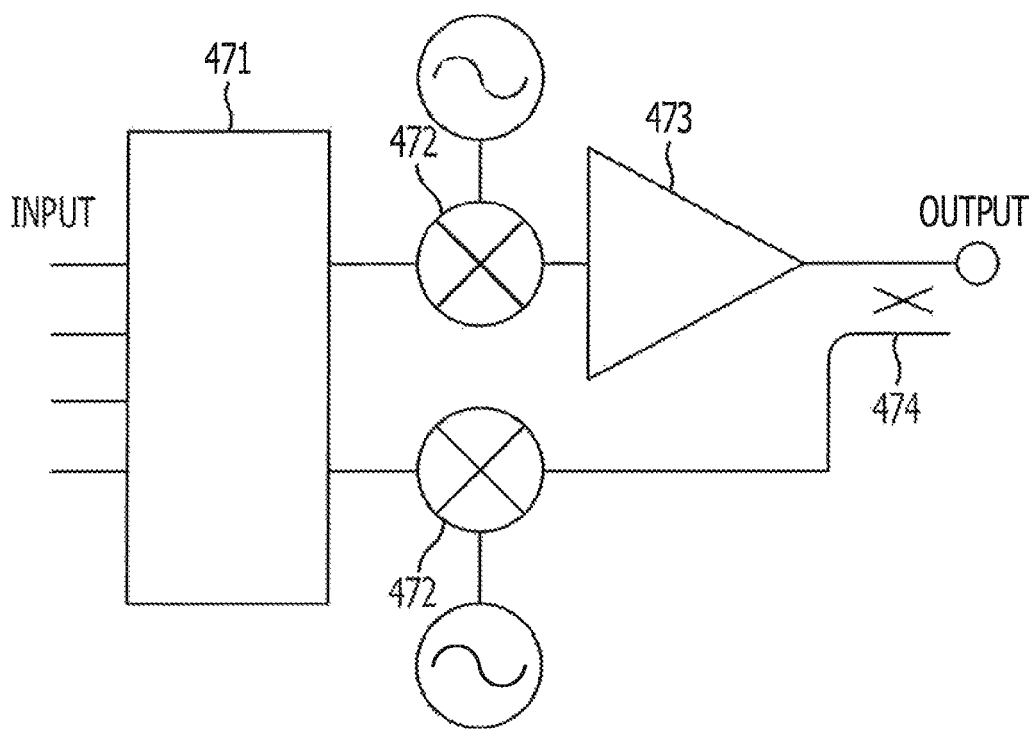
FIG. 31 is a structural drawing of a high-power amplifier in the fourth embodiment.

The high-frequency amplifier in this embodiment is described with reference to FIG. 31. A high-frequency amplifier 470 in this embodiment may be applied to a base station power amplifier of a cellular phone, for example. The high-frequency amplifier 470 has a digital predistortion circuit 471, mixers 472, a power amplifier 473, and a directional coupler 474. The digital predistortion circuit 471 compensates for nonlinear distortion of an input signal. The mixers 472 mix the input signal whose nonlinear distortion has been compensated for and an alternating signal. The power amplifier 473 amplifies the input signal mixed with the alternating signal. In the example illustrated in FIG. 31, the power amplifier 473 has the semiconductor devices in the first to third embodiments. The directional coupler 474 performs, for example, monitoring of input signals and output signals. In the circuit illustrated in FIG. 31, an output signal may be mixed with an alternating signal by the mixers 472 by flip of a switch to be sent to the digital predistortion circuit 471, for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
    a first nitride semiconductor layer formed over a substrate;
    a second nitride semiconductor layer formed over the first nitride semiconductor layer;
    element isolation regions formed in a part of the second nitride semiconductor layer and the first nitride semiconductor layer;
    a gate electrode, source electrodes, and a drain electrode formed over the second semiconductor layer and the element isolation regions; and
    a drain field plate formed over the second semiconductor layer and the element isolation regions in such a manner as to project from upper portions of side surfaces of the drain electrode.

2. The semiconductor device according to claim 1, further comprising:
    an insulating layer formed between the drain electrode and the gate electrode over the second nitride semiconductor layer,
    wherein the drain field plate is formed on the insulating layer.

3. The semiconductor device according to claim 1, wherein the substrate is formed of a material containing silicon.

4. The semiconductor device according to claim 1, wherein the element isolation regions are formed by performing ion implantation of ions containing any one of elements of Ar, H, He, N, F, Mg, Zn, and O into a part of the second nitride semiconductor layer and the first nitride semiconductor layer.

5. The semiconductor device according to claim 1, wherein, of the insulating layer formed around the drain electrode, a film thickness of the insulating layer formed on the element isolation regions is thinner than a film thickness of the insulating layer formed on a region except the element isolation regions.

6. The semiconductor device according to claim 1, wherein the insulating layer is formed of a material containing silicon nitride or silicon oxide.

7. The semiconductor device according to claim 1, wherein the gate electrode has gate fingers and a gate finger connection portion which connects the gate fingers,
    the gate fingers are formed between the source electrodes and the drain electrode, and
    the gate finger connection portion is formed on the element isolation region.

8. The semiconductor device according to claim 1, wherein the first nitride semiconductor layer is formed of a material containing GaN.

9. The semiconductor device according to claim 1, wherein the second nitride semiconductor layer is formed of a material containing AlGaN.

10. A semiconductor device comprising:
    a first nitride semiconductor layer formed over a substrate;
    a second nitride semiconductor layer formed over the first nitride semiconductor layer;
    element isolation regions formed in a part of the second nitride semiconductor layer and the first nitride semiconductor layer;
    an insulating layer formed over the second nitride semiconductor layer and the element isolation regions;
    a gate electrode, source electrodes, and a drain electrode which are formed in the insulating layer and which are formed in such a manner as to project from the insulating layer; and
    a drain field plate formed over the second semiconductor layer and the element isolation regions and on the insulating layer in such a manner as to project from upper portions of side surfaces of the drain electrode.

11. A method for manufacturing a semiconductor device, the method comprising:
    successively forming a first nitride semiconductor layer and a second nitride semiconductor layer with a nitride semiconductor on a substrate by epitaxial growth;
    forming element isolation regions in a part of the second nitride semiconductor layer and the first nitride semiconductor layer;
    forming an insulating layer on the second nitride semiconductor layer and the element isolation regions;
    forming, in the insulating layer, a first opening portion which exposes a part of the second nitride semiconductor layer;
    forming, in the insulating layer, a second opening portion which exposes a part of the second nitride semiconductor layer;
    forming, on the insulating layer, a resist pattern having a third opening portion larger than the second opening portion formed in the insulating layer,
    forming, in the first opening portion, a source electrode projecting from the first opening portion;

forming, in the second opening portion, a drain electrode projecting from the second opening portion projecting from upper portions of side surfaces of the drain electrode;

forming a metal film on a surface where the resist pattern is formed; and removing the metal film formed on the resist pattern by lift off.

12. The method for manufacturing a semiconductor device according to claim 11, wherein the forming the element isolation regions includes performing ion implantation of ions containing any one of elements of Ar, H, He, N, F, Mg, Zn, and O into a part of the second nitride semiconductor layer and the first nitride semiconductor layer.

13. The method for manufacturing a semiconductor device according to claim 11, wherein the forming the element isolation regions includes removing a part of the second nitride semiconductor layer and the first nitride semiconductor layer.

14. The method for manufacturing a semiconductor device according to claim 11, wherein the forming the element isolation regions includes reducing a thickness of the insulating layer formed on the element isolation regions after forming the insulating layer.

\* \* \* \* \*